(12) United States Patent
Katsuno et al.

(10) Patent No.: US 9,136,253 B2
(45) Date of Patent: Sep. 15, 2015

(54) SEMICONDUCTOR LIGHT EMITTING DEVICE

(71) Applicant: Kabushiki Kaisha Toshiba, Minato-ku (JP)

(72) Inventors: Hiroshi Katsuno, Ishikawa-ken (JP); Shinji Saito, Kanagawa-ken (JP); Rei Hashimoto, Tokyo (JP); Jongil Hwang, Ishikawa-ken (JP); Shinya Nunoue, Chiba-ken (JP)

(73) Assignee: Kabushiki Kaisha Toshiba, Minato-ku (JP)

( * ) Notice: Subject to any disclaimer, the term of this patent is extended or adjusted under 35 U.S.C. 154(b) by 0 days.

(21) Appl. No.: 14/176,431

(22) Filed: Feb. 10, 2014

(65) Prior Publication Data

US 2015/0001572 A1    Jan. 1, 2015

(30) Foreign Application Priority Data

Jun. 26, 2013  (JP) ................................ 2013-134282

(51) Int. Cl.
*H01L 33/00* (2010.01)
*H01L 25/075* (2006.01)

(52) U.S. Cl.
CPC ................... *H01L 25/0756* (2013.01)

(58) Field of Classification Search
USPC ........................................... 257/98, 99, 100
See application file for complete search history.

(56) References Cited

U.S. PATENT DOCUMENTS

2010/0032691 A1*  2/2010  Kim ................................ 257/88
2014/0061601 A1*  3/2014  Kim et al. ....................... 257/40

FOREIGN PATENT DOCUMENTS

JP         2008-263127         10/2008

* cited by examiner

*Primary Examiner* — Tan N Tran
(74) *Attorney, Agent, or Firm* — Oblon, McClelland, Maier & Neustadt, L.L.P.

(57) ABSTRACT

According to one embodiment, a semiconductor light emitting device includes: a conductive layer; a first stacked body; a second stacked body; a first light-transmissive electrode; and a first interconnect electrode. The first stacked body includes a first semiconductor layer and a second semiconductor layer. The second semiconductor layer is provided between the first semiconductor layer and the conductive layer. The first light emitting layer is provided between the first semiconductor layer and the second semiconductor layer. The second stacked body includes a third semiconductor layer, a fourth semiconductor layer, and a second light emitting layer. The fourth semiconductor layer is provided between the third semiconductor layer and the conductive layer. The second light emitting layer is provided between the third semiconductor layer and the fourth semiconductor layer. The first interconnect electrode is provided between the second semiconductor layer and the third semiconductor layer.

8 Claims, 22 Drawing Sheets

SEMICONDUCTOR LIGHT EMITTING DEVICE

CROSS-REFERENCE TO RELATED APPLICATIONS

This application is based upon and claims the benefit of priority from Japanese Patent Application No. 2013-134282, filed on Jun. 26, 2013; the entire contents of which are incorporated herein by reference.

FIELD

Embodiments described herein relate generally to a semiconductor light emitting device.

BACKGROUND

A multi-color LED structure in which multiple LED chips are stacked has been proposed as a structure of semiconductor light emitting devices such as LEDs (Light Emitting Diodes), etc. Because multiple LED chips are stacked, there are cases where the light extraction efficiency decreases and/or the heat dissipation decreases due to the thicknesses of the substrates, the stacking method, etc. There are cases where color breakup occurs because the light emitting regions are different between the multiple LED chips. For the semiconductor light emitting device, it is desirable to increase the light extraction efficiency, suppress color breakup, etc.

DETAILED DESCRIPTION

Figure 1A:
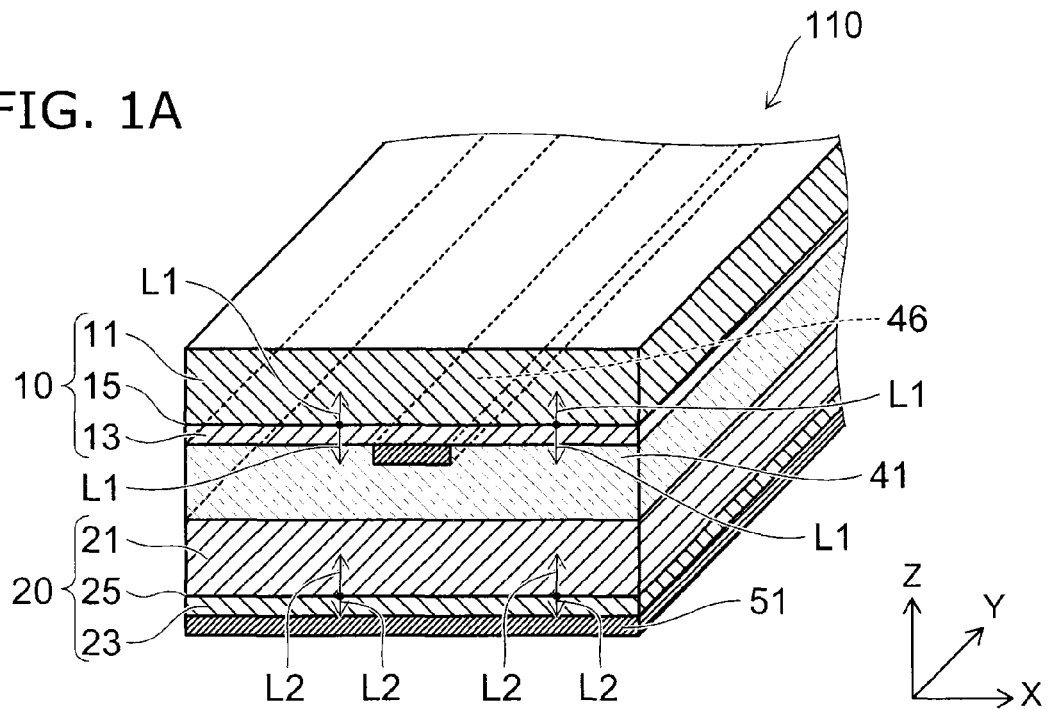
FIG. 1A and FIG. 1B are schematic perspective views showing the general concept of a semiconductor light emitting device according to a first embodiment.

In general, according to one embodiment, a semiconductor light emitting device includes: a conductive layer; a first stacked body; a second stacked body; a first light-transmissive electrode; and a first interconnect electrode. The first stacked body includes a first semiconductor layer and a second semiconductor layer. The first semiconductor layer is provided to be separated from the conductive layer in a first direction. The second semiconductor layer is provided between the first semiconductor layer and the conductive layer. The first light emitting layer is provided between the first semiconductor layer and the second semiconductor layer. The second stacked body includes a third semiconductor layer, a fourth semiconductor layer, and a second light emitting layer. The third semiconductor layer is provided between the second semiconductor layer and the conductive layer. The fourth semiconductor layer is provided between the third semiconductor layer and the conductive layer. The second light emitting layer is provided between the third semiconductor layer and the fourth semiconductor layer. The first light-transmissive electrode is provided between the second semiconductor layer and the third semiconductor layer. The first light-transmissive electrode has ohmic contacts with the second semiconductor layer. The first light-transmissive electrode is configured to transmit light emitted by the first light emitting layer and the second light emitting layer. The first interconnect electrode is provided between the second semiconductor layer and the third semiconductor layer. The first interconnect electrode is electrically connected to the first light-transmissive electrode.

Embodiments will now be described with reference to the drawings.

The drawings are schematic or conceptual; and the relationships between the thicknesses and widths of portions, the proportions of sizes between portions, etc., are not necessarily the same as the actual values thereof. Further, the dimensions and/or the proportions may be illustrated differently between the drawings, even for identical portions.

In the drawings and the specification of the application, components similar to those described in regard to a drawing thereinabove are marked with like reference numerals, and a detailed description is omitted as appropriate.

First Embodiment

Figure 1B:
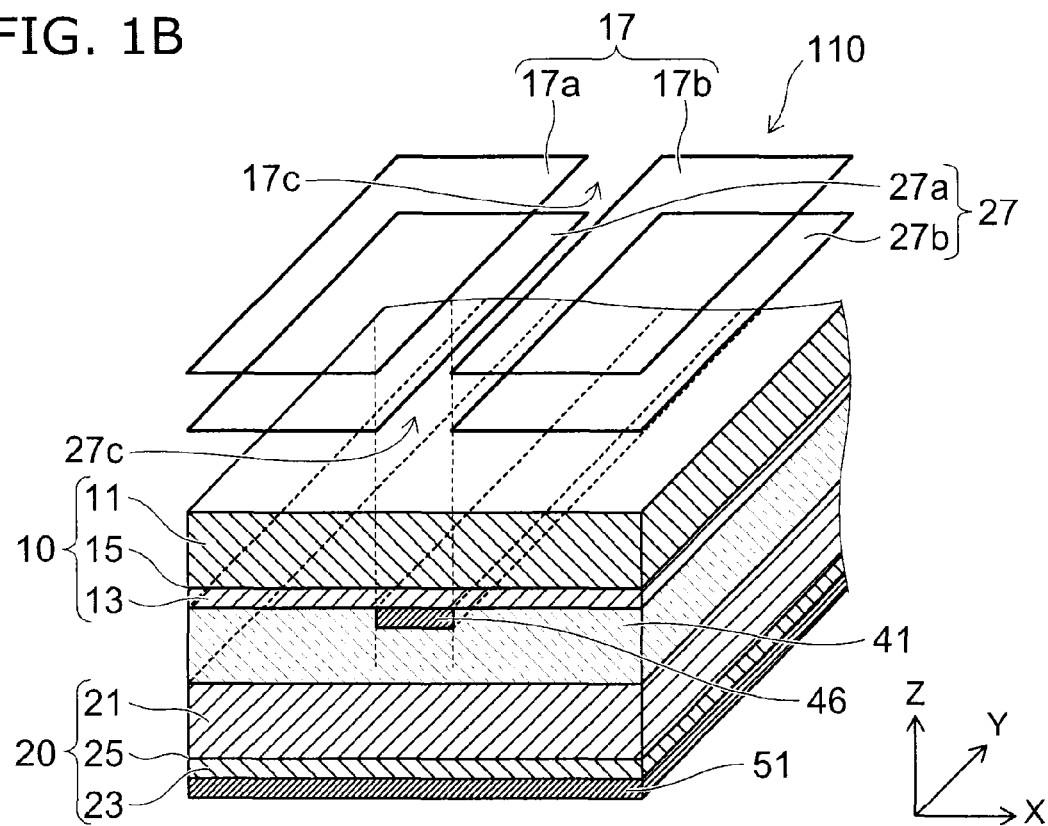

FIG. 1A and FIG. 1B are schematic perspective views showing the general concept of a semiconductor light emitting device according to a first embodiment.

FIG. 1A is a schematic perspective view showing the general concept of the structure of the semiconductor light emitting device according to the first embodiment. FIG. 1B is a schematic perspective view showing an extraction region of light emitted from a first light emitting layer and an extraction region of light emitted from a second light emitting layer.

The semiconductor light emitting device 110 shown in FIG. 1A and FIG. 1B includes a first stacked body 10, a second stacked body 20, a first light-transmissive electrode 41, a first interconnect electrode 46, and a reflecting electrode 51 (a conductive layer).

The first stacked body 10 includes a first semiconductor layer 11, a second semiconductor layer 13, and a first light emitting layer 15.

The second stacked body 20 includes a third semiconductor layer 21, a fourth semiconductor layer 23, and a second light emitting layer 25.

The first semiconductor layer 11 has a first conductivity type. The second semiconductor layer 13 has a second conductivity type. The second conductivity type is different from the first conductivity type. For example, the first conductivity type is the n-type. For example, the second conductivity type is the p-type. The first conductivity type may be the p-type. The second conductivity type may be the n-type. In the following example, the first conductivity type is the n-type. In the following example, the second conductivity type is the p-type.

The third semiconductor layer 21 has a third conductivity type. The fourth semiconductor layer 23 has a fourth conductivity type. The fourth conductivity type is different from the third conductivity type. For example, the third conductivity type is the n-type. For example, the fourth conductivity type is the p-type. The third conductivity type may be the p-type. The fourth conductivity type may be the n-type. In the following example, the third conductivity type is the n-type. In the following example, the fourth conductivity type is the p-type.

The first semiconductor layer 11 is separated from the reflecting electrode 51 in a first direction. The second semiconductor layer 13 is provided between the first semiconductor layer 11 and the reflecting electrode 51. The first light emitting layer 15 is provided between the first semiconductor layer 11 and the second semiconductor layer 13. For example, as shown in FIG. 1A, the first light emitting layer 15 emits a first light L1. The first light L1 has a first peak wavelength.

A direction from the reflecting electrode 51 toward the first semiconductor layer 11 is taken as a Z axis. One direction orthogonal to the Z-axis direction is taken as an X-axis direction. A direction orthogonal to the Z-axis direction and the X-axis direction is taken as a Y-axis direction. In the example, the Z-axis direction is aligned with the first direction.

The third semiconductor layer 21 is provided between the second semiconductor layer 13 and the reflecting electrode 51. The fourth semiconductor layer 23 is provided between the third semiconductor layer 21 and the reflecting electrode 51. The second light emitting layer 25 is provided between the third semiconductor layer 21 and the fourth semiconductor layer 23. For example, as shown in FIG. 1A, the second light emitting layer 25 emits a second light L2. The second light L2 has a second peak wavelength. The second peak wavelength of the second light L2 is different from the first peak wavelength of the first light L1.

The first light-transmissive electrode 41 is provided between the second semiconductor layer 13 and the third semiconductor layer 21. The first light-transmissive electrode 41 has an ohmic contact with the second semiconductor layer 13. The first light-transmissive electrode 41 has an ohmic contact with the third semiconductor layer 21. The first light-transmissive electrode 41 transmits the first light L1 emitted by the first light emitting layer 15. The first light-transmissive electrode 41 transmits the second light L2 emitted by the second light emitting layer 25.

The first light-transmissive electrode 41 has a transmittance of 50% or more for the light emitted from the first light emitting layer 15. The first light-transmissive electrode 41 has a transmittance of 50% or more for the light emitted from the second light emitting layer 25. The first light-transmissive electrode 41 is conductive. The first light-transmissive electrode 41 includes a material that can have an ohmic contact with at least one selected from a p-type semiconductor layer and an n-type semiconductor layer. For example, ITO, ITON, ZnO, etc., may be used as the material of the first light-transmissive electrode 41. The thickness (the length in the Z-axis direction) of the first light-transmissive electrode 41 is, for example, not less than about 10 nanometers (nm) and not more than about 10000 nm. The transmittance of the light is higher when the thickness of the first light-transmissive electrode 41 is relatively thin. The sheet resistance of the first light-transmissive electrode 41 is lower in the case where the thickness of the first light-transmissive electrode 41 is relatively thick. Thereby, the spreading properties of the current flowing through the first light-transmissive electrode 41 improves. The first light-transmissive electrode 41 may include a relatively thin metal and/or an oxide of a relatively thin metal.

The first interconnect electrode 46 is provided between the second semiconductor layer 13 and the third semiconductor layer 21. The first interconnect electrode 46 is electrically connected to the first light-transmissive electrode 41.

The first light emitting layer 15 is positioned inside the reflecting electrode 51 when projected onto a plane perpendicular to the first direction. This is elaborated below. The reflecting electrode 51 has an ohmic contact with the fourth semiconductor layer 23. The reflecting electrode 51 includes, for example, silver (Ag).

The first light-transmissive electrode 41 is used as both an ohmic electrode of the second semiconductor layer 13 and an ohmic electrode of the third semiconductor layer 21. That is, the first light-transmissive electrode 41 is a common ohmic electrode between the second semiconductor layer 13 and the third semiconductor layer 21.

The first interconnect electrode 46 is used as both an interconnect electrode of the second semiconductor layer 13 and an interconnect electrode of the third semiconductor layer 21. That is, the first interconnect electrode 46 is a common interconnect electrode between the second semiconductor layer 13 and the third semiconductor layer 21.

The first interconnect electrode 46 has a non-ohmic contact with the second semiconductor layer 13.

The first light L1 that is emitted from the first light emitting layer 15 toward the reflecting electrode 51 is reflected by the reflecting electrode 51 mainly in the Z-axis direction. The second light L2 that is emitted from the second light emitting layer 25 toward the reflecting electrode 51 is reflected by the reflecting electrode mainly in the Z-axis direction. In the semiconductor light emitting device 110 according to the embodiment, the light that is emitted from the first light emitting layer 15 is extracted mainly in the Z-axis direction. In the semiconductor light emitting device 110 according to the embodiment, the light that is emitted from the second light emitting layer 25 is extracted mainly in the Z-axis direction. In the specification of the application, being "mainly in the Z-axis direction" includes not only directions that are strictly parallel to the Z-axis direction but also directions that are oblique to the Z-axis direction and have components parallel to the Z-axis direction that are greater than the components perpendicular to the Z-axis direction.

A non-light emitting region 17c of the first light emitting layer 15 occurs for the first light L1 that is emitted from the first light emitting layer 15 and extracted in the Z-axis direction. Therefore, for example, as shown in FIG. 1B, a first light extraction region 17 has a first extraction portion 17a and a second extraction portion 17b. The first extraction portion 17a is separated from the second extraction portion 17b in a plane (the XY plane) perpendicular to the Z-axis direction.

A shadow 27c occurs due to the first interconnect electrode 46 for the second light L2 that is emitted from the second light emitting layer 25 and extracted in the Z-axis direction. Therefore, for example, as shown in FIG. 1B, a second light extraction region 27 has a third extraction portion 27a and a fourth extraction portion 27b. The third extraction portion 27a is separated from the fourth extraction portion 27b in the plane (the XY plane) perpendicular to the Z-axis direction.

As described above, the first light-transmissive electrode 41 is a common ohmic electrode between the second semiconductor layer 13 and the third semiconductor layer 21. The first interconnect electrode 46 is a common interconnect electrode between the second semiconductor layer 13 and the third semiconductor layer 21.

According to the embodiment, the number of ohmic electrodes disposed and the number of interconnect electrodes disposed can be reduced. By reducing the number of ohmic electrodes disposed and the number of interconnect electrodes disposed, the first light extraction region 17 and the second light extraction region 27 are widened. Thereby, the luminous efficiency of the semiconductor light emitting device 110 can be increased.

According to the embodiment, the first light extraction region 17 and the second light extraction region 27 can be aligned by self-alignment. That is, the first extraction portion 17a and the third extraction portion 27a can be aligned by self-alignment. The second extraction portion 17b and the fourth extraction portion 27b can be aligned by self-alignment. In other words, the position of the non-light emitting region 17c and the position of the shadow 27c can be aligned by self-alignment in the XY plane. Thereby, color breakup can be suppressed.

Figure 2A:
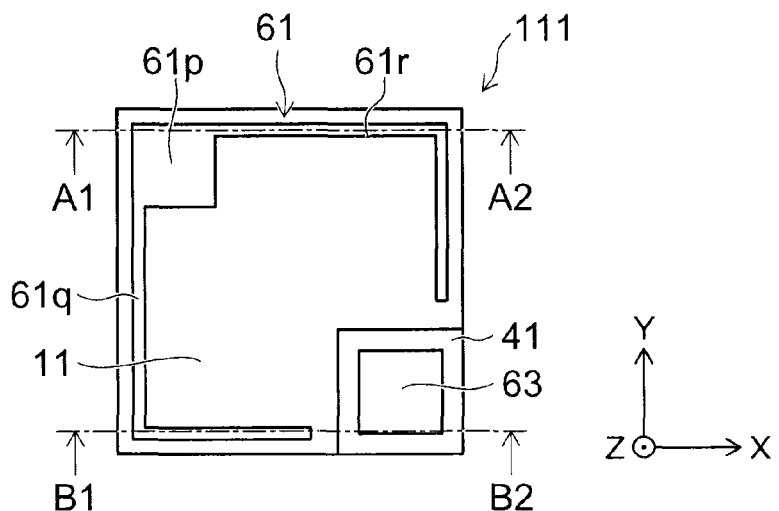
FIG. 2A to FIG. 2C are schematic views showing a semiconductor light emitting device according to the first embodiment.
Figure 2B:
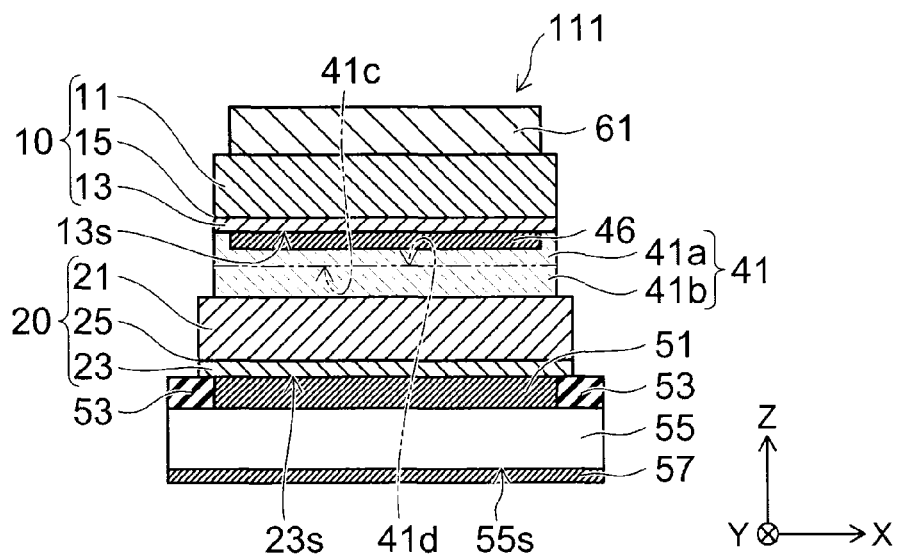
Figure 2C:
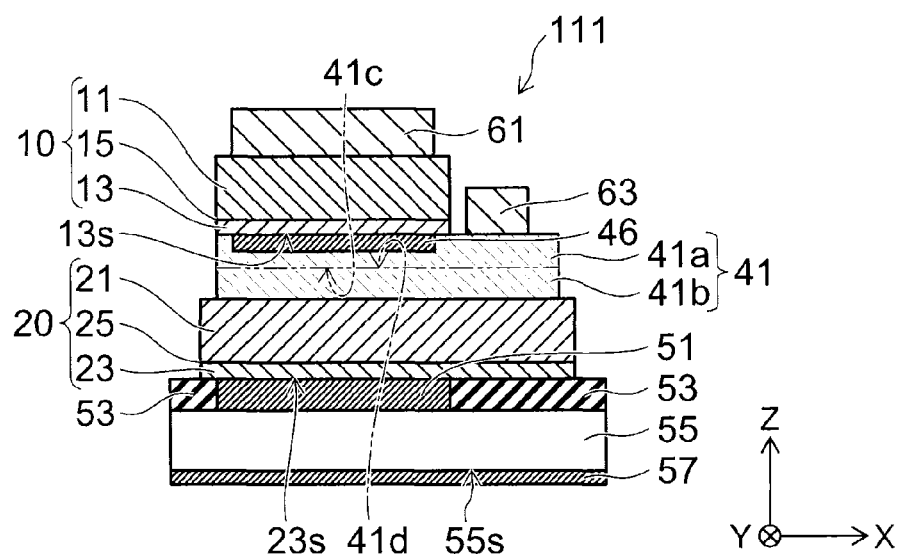

FIG. 2A to FIG. 2C are schematic views showing a semiconductor light emitting device according to the first embodiment.

Figure 3A:
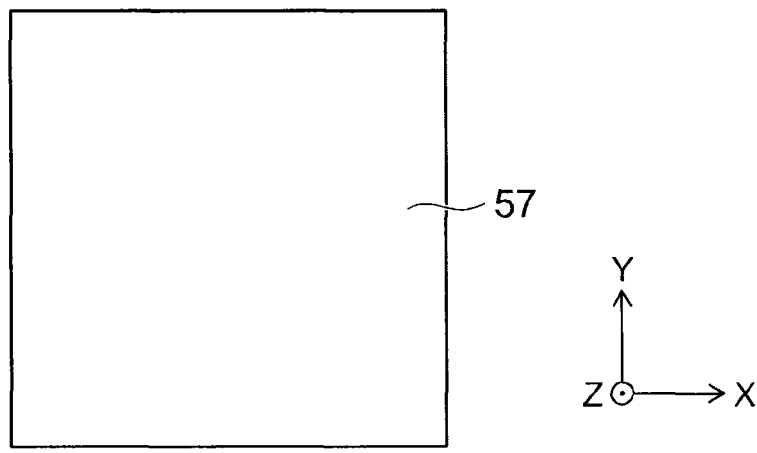
FIG. 3A to FIG. 3C are schematic plan views showing components of the semiconductor light emitting device according to the first embodiment.
Figure 3B:
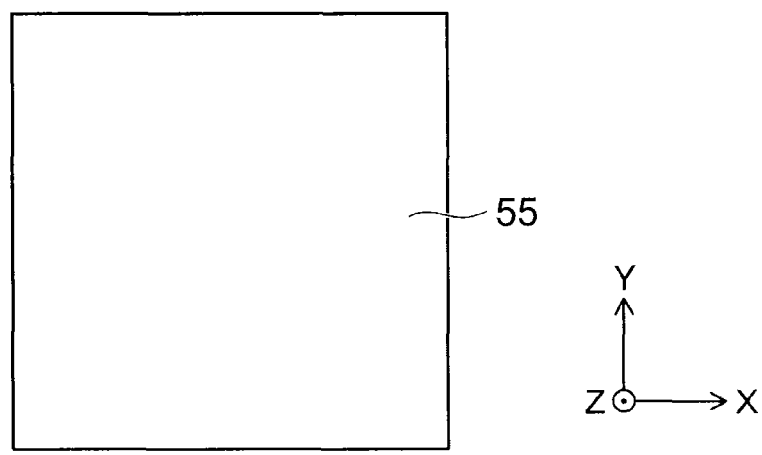
Figure 3C:
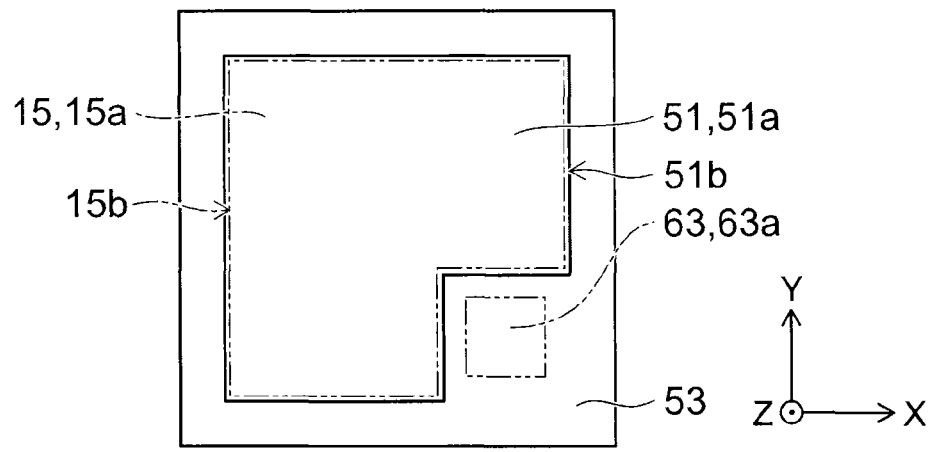

FIG. 3A to FIG. 3C are schematic plan views showing components of the semiconductor light emitting device according to the first embodiment.

Figure 4A:
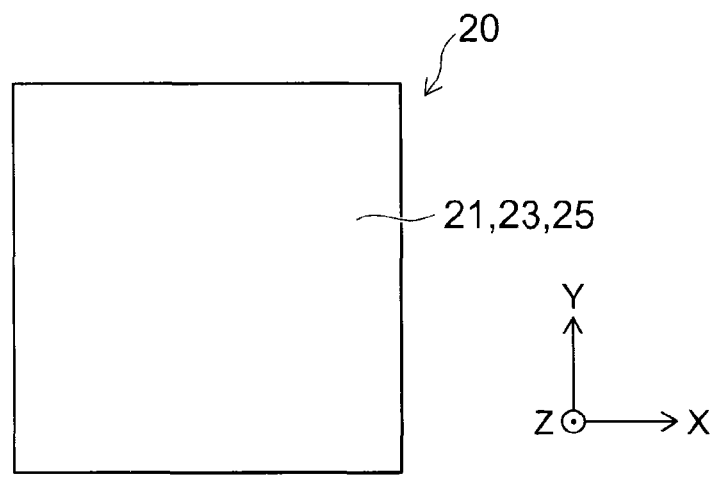
FIG. 4A to FIG. 4C are schematic plan views showing other components of the semiconductor light emitting device according to the first embodiment.
Figure 4B:
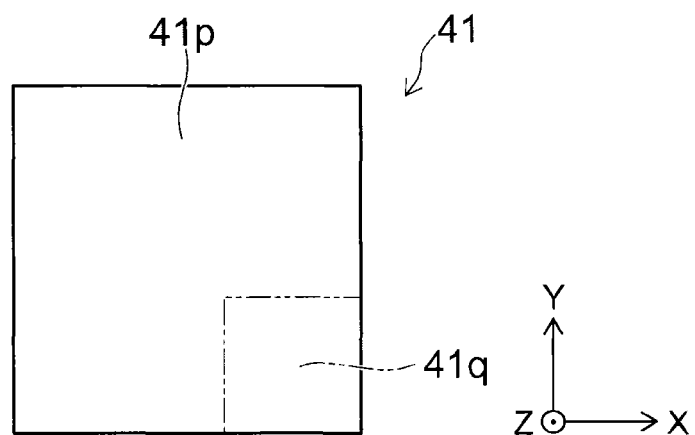
Figure 4C:
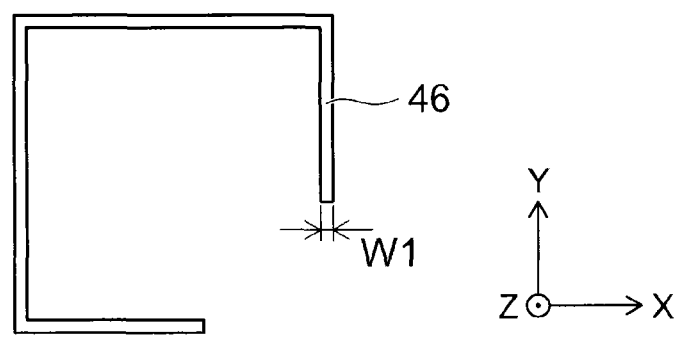

FIG. 4A to FIG. 4C are schematic plan views showing other components of the semiconductor light emitting device according to the first embodiment.

Figure 5A:
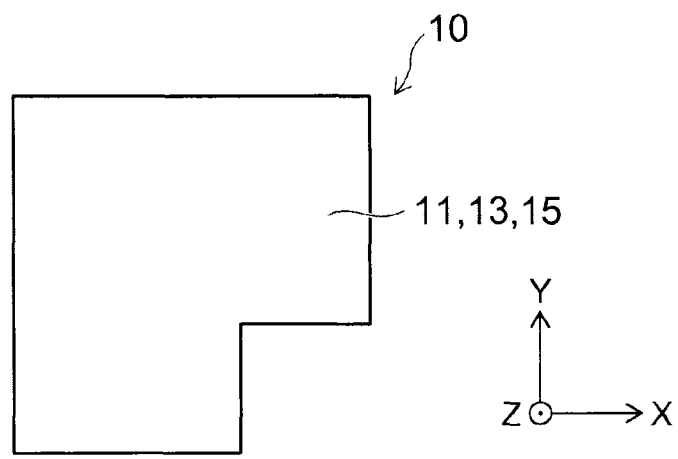
FIG. 5A to FIG. 5C are schematic plan views showing other components of the semiconductor light emitting device according to the first embodiment.
Figure 5B:
Figure 5C:
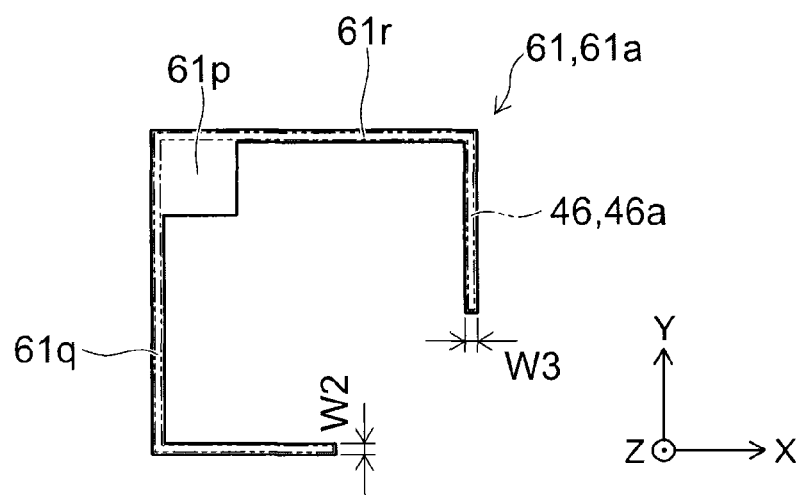

FIG. 5A to FIG. 5C are schematic plan views showing other components of the semiconductor light emitting device according to the first embodiment.

FIG. 2A is a schematic plan view showing the semiconductor light emitting device according to the first embodiment. FIG. 2B is a cross-sectional view along line A1-A2 shown in FIG. 2A. FIG. 2C is a cross-sectional view along line B1-B2 shown in FIG. 2A.

The semiconductor light emitting device 111 shown in FIG. 2A to FIG. 2C includes the first stacked body 10, the second stacked body 20, the first light-transmissive electrode 41, the first interconnect electrode 46, the reflecting electrode 51, an insulating layer 53, a support substrate 55, a back surface electrode 57, a first electrode 61, and a second electrode 63.

The first stacked body 10 includes the first semiconductor layer 11, the second semiconductor layer 13, and the first light emitting layer 15.

The second stacked body 20 includes the third semiconductor layer 21, the fourth semiconductor layer 23, and the second light emitting layer 25.

The first semiconductor layer 11, the second semiconductor layer 13, the first light emitting layer 15, the third semiconductor layer 21, the fourth semiconductor layer 23, and the second light emitting layer 25 are similar to those described above in regard to FIG. 1A and FIG. 1B. A detailed description of these components is omitted as appropriate.

The back surface electrode 57 is separated from the reflecting electrode 51 in a direction (in the example, the negative Z-axis direction) opposite to the first direction. The support substrate 55 is provided between the back surface electrode 57 and the reflecting electrode 51. The support substrate 55 is, for example, a silicon substrate, etc. As shown in FIG. 2B to FIG. 3B, the back surface electrode 57 is provided at a surface (a first support substrate surface 55s) of the support substrate 55.

As shown in FIG. 3C, the insulating layer 53 is provided around the reflecting electrode 51. The insulating layer includes, for example, $SiO_2$.

As shown in FIG. 4B, the first light-transmissive electrode 41 has a first transmissive portion 41p and a second transmissive portion 41q. The first transmissive portion 41p is provided between the second semiconductor layer 13 and the third semiconductor layer 21. The second transmissive portion 41q is arranged with the first transmissive portion 41p in the plane perpendicular to the first direction. In other words, the second transmissive portion 41q is arranged with the first transmissive portion 41p in a direction perpendicular to the first direction. In the first direction, the first transmissive portion 41p may be aligned with the first light emitting layer 15.

The first semiconductor layer 11 is disposed between the first electrode 61 and the first light emitting layer 15. The first electrode 61 is electrically connected to the first semiconductor layer 11. As shown in FIG. 2A and FIG. 5C, the first electrode 61 includes a pad portion 61p, a first fine wire portion 61q, and a second fine wire portion 61r. The first fine wire portion 61q extends outward from the pad portion 61p with the pad portion 61p as a base portion. The second fine wire portion 61r extends outward from the pad portion 61p with the pad portion 61p as a base portion.

As shown in FIG. 2C, the second transmissive portion 41q is disposed between the second electrode 63 and the third semiconductor layer 21. The second electrode 63 is electrically connected to the second semiconductor layer 13. The second electrode 63 is electrically connected to the third semiconductor layer 21.

As shown in FIG. 3C and FIG. 5A, the outer edge (a first light emitting layer outer edge 15b) of a first light emitting layer region 15a that is formed by projecting the first light emitting layer 15 onto the plane perpendicular to the first direction (in the example, the Z-axis direction) is positioned inside the outer edge of a reflecting electrode region 51a (a reflecting electrode outer edge 51b) formed by projecting the reflecting electrode 51 onto the plane perpendicular to the first direction. In other words, in the first direction, the first light emitting layer 15 is positioned inside the reflecting electrode 51. In the first direction, the reflecting electrode 51 may be aligned with the first light emitting layer 15. In the first direction, the reflecting electrode 51 may be aligned with the first transmissive portion 41p.

Thereby, the first light extraction region 17 (referring to FIG. 1B) can be set to be substantially the same as the second light extraction region 27 (referring to FIG. 1B); and uneven color can be reduced while increasing the light extraction efficiency.

As shown in FIG. 3C and FIG. 5B, a second electrode region 63a that is formed by projecting the second electrode 63 onto the plane perpendicular to the first direction (in the example, the Z-axis direction) is separated from the reflecting electrode region 51a formed by projecting the reflecting electrode 51 onto the plane perpendicular to the first direction. In other words, the second electrode 63 is separated from the reflecting electrode 51 in a direction perpendicular to the first direction.

In the first direction, the light emitted at a position overlapping the second electrode 63 is absorbed relatively easily by the second electrode 63. In the case where the second electrode 63 is separated from the reflecting electrode 51 in the direction perpendicular to the first direction, the proportion of the light that reaches the second electrode 63 and is absorbed can be reduced; and the light extraction efficiency can be increased.

As shown in FIG. 5C, at least a portion of a first electrode region 61a that is formed by projecting the first electrode 61 onto the plane perpendicular to the first direction overlaps a first interconnect region 46a formed by projecting the first interconnect electrode 46 onto the plane perpendicular to the first direction. In other words, in the first direction, at least a portion of the first electrode 61 overlaps the first interconnect electrode 46. Thereby, the first light extraction region 17 can be more substantially the same as the second light extraction region 27; and uneven color can be reduced while increasing the light extraction efficiency.

An example of a method for manufacturing the semiconductor light emitting device 111 shown in FIG. 2A to FIG. 2C will now be described.

A second crystal layer that includes the second stacked body 20 in which the third semiconductor layer 21, the second light emitting layer 25, and the fourth semiconductor layer 23 are provided in this order is grown on a growth substrate (e.g., a sapphire substrate, a silicon (Si) substrate, etc.) by MOCVD (Metal Organic Chemical Vapor Deposition). Thereby, a second semiconductor wafer is made. The second light emitting layer 25 emits the second light L2 of the second peak wavelength.

$SiO_2$ (in the example of FIG. 2B and FIG. 2C, the insulating layer 53) is formed with a thickness of 400 nm on the second crystal layer (in the example, on the fourth semiconductor layer 23) including the second stacked body 20.

Silver (Ag) is formed with a thickness of 200 nm on the fourth semiconductor layer 23 from which the $SiO_2$ is removed by lift-off; and heat treatment is performed. For example, heat treatment at 300° C. in oxygen or heat treatment at 800° C. in oxygen is performed. Thereby, the reflecting electrode 51 is formed on the fourth semiconductor layer 23.

A barrier metal and a metal layer for solder bonding (TiW 50 nm/Pt 100 nm/TiW 50 nm/Pt 100 nm/Ti 100 nm/Au 50 nm) are formed on substantially the entire surface (a fourth semiconductor layer surface 23s) of the fourth semiconductor layer 23 (referring to FIG. 2B and FIG. 2C). Thereby, the reflecting electrode 51 is covered with the barrier metal and the metal layer for solder bonding.

A silicon substrate on which AuSn solder is formed with a thickness of 2000 nm is prepared separately. The silicon substrate is bonded to the second semiconductor wafer described above at, for example, about 280° C. Liquid phase diffusion bonding that uses a solder layer such as AuIn, NiSn, etc., may be used to bond the silicon substrate to the second semiconductor wafer. For the bonding temperature (not less than 200° C. and not more than 250° C.) in such a case, the melting point of the solder layer is not less than 400° C. and not more than 1100° C. The process temperatures after the solder bonding can be set to be not less than the bonding temperature.

The growth substrate is removed. In the case where the growth substrate is a sapphire substrate, the growth substrate is removed by LLO (laser lift-off). In the case where the growth substrate is a silicon substrate, the growth substrate is removed by dry etching, etc.

Dry etching of the second crystal layer that is exposed by removing the growth substrate is performed. Thereby, the third semiconductor layer 21 is exposed.

A light-transmissive electrode (e.g., ITO, etc.) is formed with a thickness of 400 nm on the exposed third semiconductor layer 21; and heat treatment is performed. For example, the heat treatment is performed at 700° C. in nitrogen. Thereby, a portion (a second transmissive electrode portion 41b) of the first light-transmissive electrode 41 (referring to FIG. 2B and FIG. 2C) is formed. The thickness (the length in the Z-axis direction) of the second transmissive electrode portion 41b is not limited to 400 nm and may be, for example, not less than about 50 nm and not more than about 10000 nm.

The surface (a second electrode surface 41d) of the second transmissive electrode portion 41b is planarized by CMP (Chemical Mechanical Polishing).

A first crystal layer that includes the first stacked body 10 in which the first semiconductor layer 11, the first light emitting layer 15, and the second semiconductor layer 13 are provided in this order is grown on a growth substrate (e.g., a sapphire substrate, a silicon (Si) substrate, etc.) by MOCVD. Thereby, a first semiconductor wafer is made. The first light emitting layer 15 emits the first light L1 of the first peak wavelength that is different from the second peak wavelength. The first peak wavelength may be longer than the second peak wavelength or shorter than the second peak wavelength. Compared to the case where the first peak wavelength is longer than the second peak wavelength, the first light emitting layer 15 does not easily absorb the second light L2 emitted from the second light emitting layer 25 when the first peak wavelength is shorter than the second peak wavelength. Thereby, the light extraction efficiency of the semiconductor light emitting device 111 increases.

A light-transmissive electrode (e.g., ITO, etc.) is formed with a thickness of 400 nm on the first crystal layer (in the example, on the second semiconductor layer 13); and heat treatment is performed. For example, the heat treatment is performed at 700° C. in nitrogen. Thereby, another portion (a first transmissive electrode portion 41a) of the first light-transmissive electrode 41 (referring to FIG. 2B and FIG. 2C) is formed.

Dry etching of the first transmissive electrode portion 41a is performed. Thereby, the second semiconductor layer 13 is exposed. Ti/Pt/Au having a thickness of 400 nm is formed by lift-off. Thereby, the first interconnect electrode 46 is formed. The first interconnect electrode 46 is electrically connected to the light-transmissive electrode formed on the second semiconductor layer 13 and is in contact with the exposed second semiconductor layer 13. The width (a first interconnect electrode width W1) of the first interconnect electrode 46 (referring to FIG. 4C) is, for example, about 10 micrometers (μm). The first interconnect electrode width W1 is not limited to 10 μm. Further, the method for making the first interconnect electrode 46 is not limited to this method. For example, only the first interconnect electrode 46 may be formed without forming the light-transmissive electrode having the thickness of 400 nm. In such a case, the heat treatment is performed after forming the light-transmissive electrode for the bonding described below.

The first interconnect electrode 46 includes a material having relatively good adhesion with each layer (in the example, the second semiconductor layer 13). The first interconnect electrode 46 includes a material having a relatively low resistivity. In the case where the first interconnect electrode width W1 is relatively narrow, the absorption region of the emitted light is relatively small. Therefore, the light extraction region increases. In the case where the first interconnect electrode width W1 is relatively wide, the resistance of the first interconnect electrode 46 is lower. Therefore, the spread of the current improves. The luminous efficiency increases. The operating voltage decreases. The life increases.

The first interconnect electrode 46 has a non-ohmic contact with the second semiconductor layer 13. The contact resistance of the first interconnect electrode 46 is higher than the contact resistance of a light-transmissive electrode 42. It is sufficient for the first interconnect electrode 46 to have a non-ohmic contact with the second semiconductor layer 13, and/or the contact resistance of the first interconnect electrode 46 to be higher than the contact resistance of the light-transmissive electrode 42. It is more desirable for the first interconnect electrode 46 to be insulated from the second semiconductor layer 13.

A light-transmissive electrode for bonding is formed on substantially the entire surface (a second semiconductor layer surface 13s) of the second semiconductor layer 13 (referring to FIG. 2B and FIG. 2C). Thereby, the other portion (the first transmissive electrode portion 41a) of the first light-transmissive electrode 41 (referring to FIG. 2B and FIG. 2C) is formed to cover the first interconnect electrode 46. The thickness (the length in the Z-axis direction) of the first transmissive electrode portion 41a is, for example, not less than about 50 nm and not more than about 10000 nm.

The surface (a first electrode surface 41c) of the first transmissive electrode portion 41a is planarized by CMP.

The first transmissive electrode portion 41a on which CMP was performed is directly bonded to the second transmissive electrode portion 41b on which CMP was performed. Plasma cleaning by an oxygen atmosphere is performed in a vacuum. The first semiconductor wafer and the second semiconductor wafer are bonded at 100° C. by applying a pressure of 1 kilonewton (kN). Thereby, the second semiconductor layer 13 is electrically connected to the third semiconductor layer 21. Thereby, the first transmissive electrode portion 41a and the second transmissive electrode portion 41b can be considered to be the same electrode (the first light-transmissive electrode 41). The first interconnect electrode 46 functions as a common interconnect electrode between the second semiconductor layer 13 and the third semiconductor layer 21.

The growth substrate of the first semiconductor wafer is removed. In the case where the growth substrate of the first semiconductor wafer is a sapphire substrate, the growth substrate is removed by LLO. In the case where the growth substrate of the first semiconductor wafer is a silicon substrate, the growth substrate is removed by dry etching, etc. Dry etching of the exposed first crystal layer is performed. Thereby, the first semiconductor layer 11 is exposed.

A portion of the first crystal layer that includes the exposed first semiconductor layer 11 is removed by dry etching. Thereby, the first light-transmissive electrode 41 is exposed.

A portion of the exposed first light-transmissive electrode 41 is removed by dry etching. Thereby, the second crystal layer (in the example, the third semiconductor layer 21) is exposed.

A portion of the exposed second crystal layer is removed by dry etching. Thereby, the $SiO_2$ that is in contact with the fourth semiconductor layer 23 is exposed.

Ti/Pt/Au is formed with a thickness of 500 nm on the exposed first light-transmissive electrode 41 by lift-off. Thereby, the second electrode 63 is formed.

Al/Ni/Au is formed with a thickness of 500 nm on the exposed first semiconductor layer 11 by lift-off. Thereby, the first electrode 61 is formed. As shown in FIG. 5C, the first electrode 61 includes the pad portion 61p, the first fine wire portion 61q, and the second fine wire portion 61r. The width (a first fine wire portion width W2) of the first fine wire portion 61q (referring to FIG. 5C) is, for example, about 10 μm. The width (a second fine wire portion width W3) of the second fine wire portion 61r (referring to FIG. 5C) is, for example, about 10 μm.

The first light-transmissive electrode 41 is used as both the light-transmissive electrode of the second semiconductor layer 13 and the light-transmissive electrode of the third semiconductor layer 21. The first interconnect electrode 46 is used as both the interconnect electrode of the second semiconductor layer 13 and the interconnect electrode of the third semiconductor layer 21.

According to the embodiment, there can be one fewer interconnect electrode. There can be one fewer light-transmissive electrode. There can be one fewer pad. The light emitting region can be enlarged. The manufacturing processes of the semiconductor light emitting device 111 can be reduced. The CMP can be performed easily for the direct bonding. Thereby, the light extraction efficiency increases. The luminous efficiency increases. The yield increases. The cost decreases. The operating voltage decreases.

In the embodiment, the interconnect electrode (in the example, the first interconnect electrode 46) that causes a shadow for the second light emitting layer 25 is the same as the interconnect electrode (in the example, the first interconnect electrode 46) that causes the non-light emitting region of the first light emitting layer 15. Therefore, the light emitting region of the first light emitting layer 15 is substantially aligned with the light extraction region of the light emitted from the major surface of the second light emitting layer 25 by self-alignment. Thereby, color breakup can be suppressed.

A dielectric (e.g., $SiO_2$, etc.) for bonding may be provided between the first stacked body 10 and the second stacked body 20. In the case where the bonding strength between the first transmissive electrode portion 41a and the second transmissive electrode portion 41b is relatively low, the dielectric for bonding can supplement the bonding strength between the first transmissive electrode portion 41a and the second transmissive electrode portion 41b.

In the example of the method for manufacturing the semiconductor light emitting device 111, an uneven structure for light extraction may be formed in the surface of the first semiconductor layer 11 at the stage where the first semiconductor layer 11 is exposed. An uneven structure for light extraction may be formed in the surface of the third semiconductor layer 21 at the stage where the third semiconductor layer 21 is exposed.

Figure 6A:
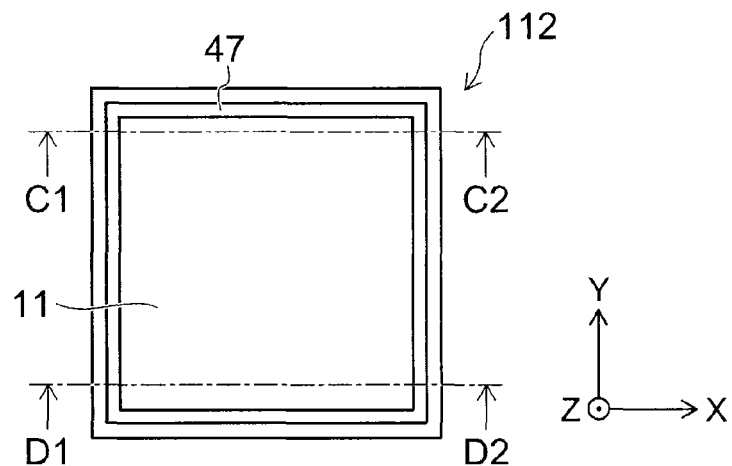
FIG. 6A to FIG. 6C are schematic views showing another semiconductor light emitting device according to the first embodiment.
Figure 6B:
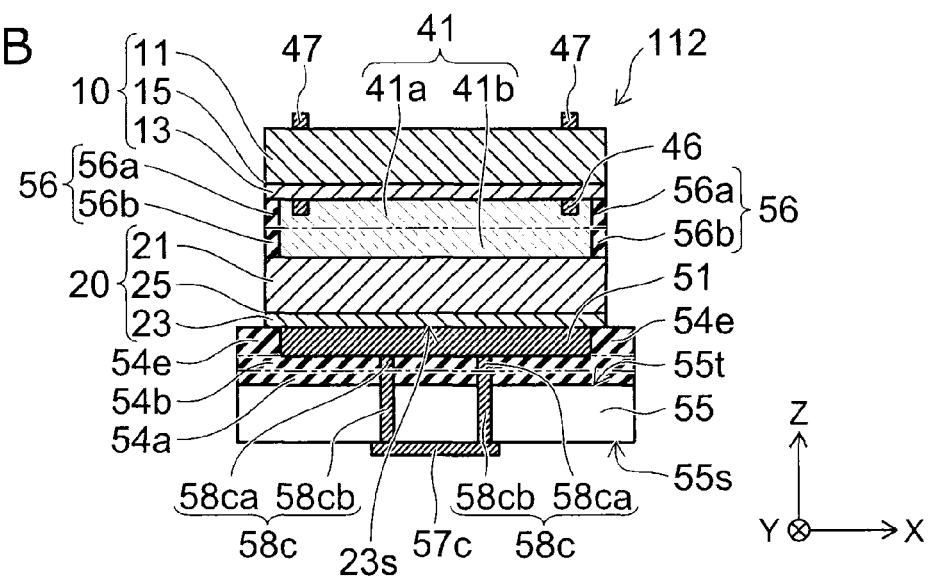
Figure 6C:
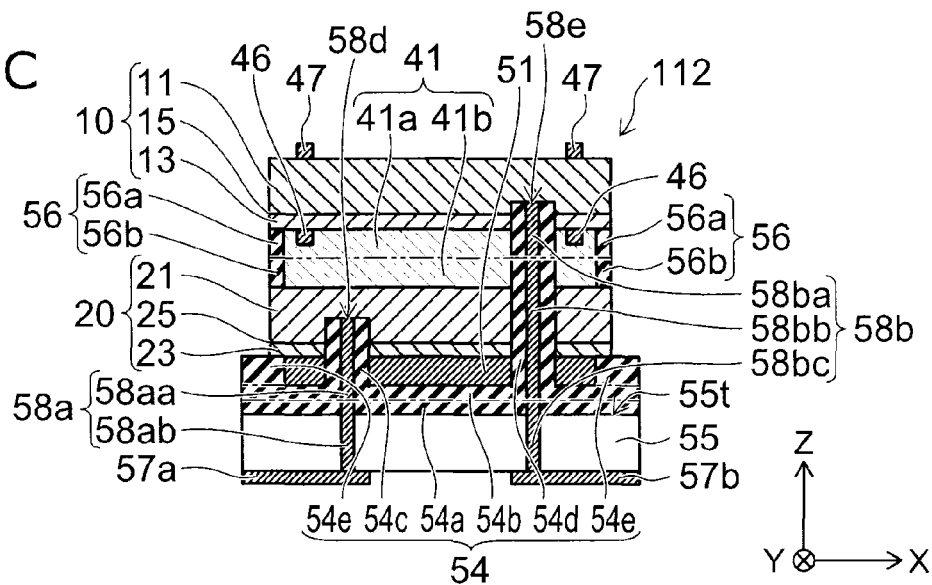

FIG. 6A to FIG. 6C are schematic views showing another semiconductor light emitting device according to the first embodiment.

FIG. 7A to FIG. 7D are schematic plan views showing components of the semiconductor light emitting device according to the first embodiment.

FIG. 8A to FIG. 8D are schematic plan views showing other components of the semiconductor light emitting device according to the first embodiment.

Figure 9A:
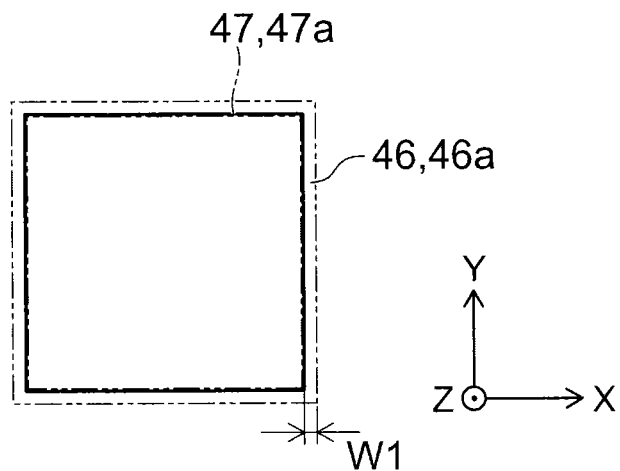
FIG. 9A to FIG. 9C are schematic plan views showing other components of the semiconductor light emitting device according to the first embodiment.
Figure 9B:
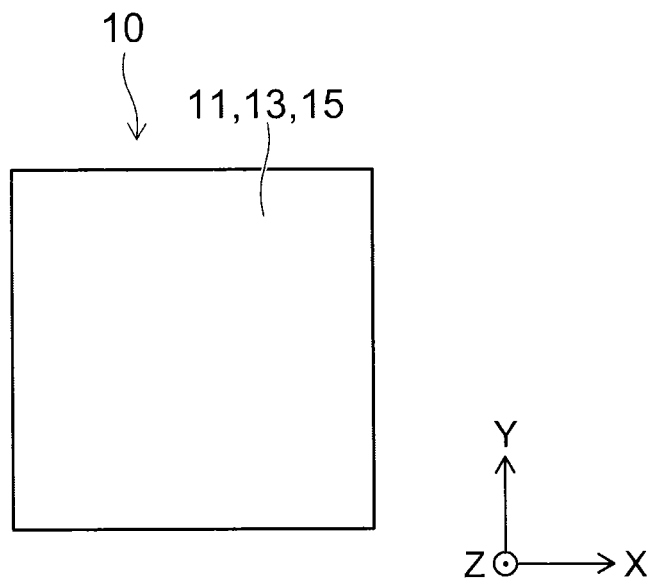
Figure 9C:
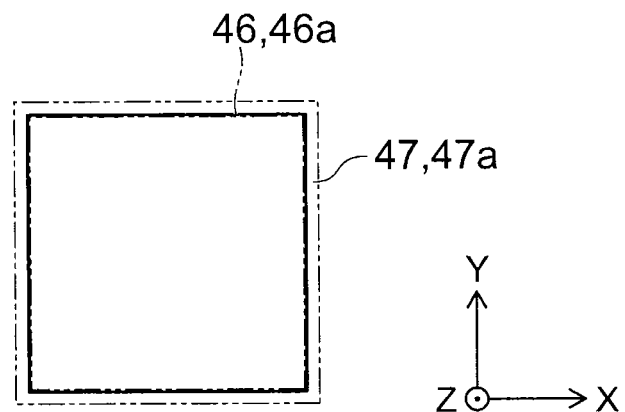

FIG. 9A to FIG. 9C are schematic plan views showing other components of the semiconductor light emitting device according to the first embodiment.

FIG. 6A is a schematic plan view showing the semiconductor light emitting device according to the first embodiment. FIG. 6B is a cross-sectional view along line C1-C2 shown in FIG. 6A. FIG. 6C is a cross-sectional view along line D1-D2 shown in FIG. 6A.

The semiconductor light emitting device 112 shown in FIG. 6A to FIG. 6C includes the first stacked body 10, the second stacked body 20, the first light-transmissive electrode 41, the first interconnect electrode 46, a second interconnect electrode 47, the reflecting electrode 51, a first bonding layer 54, a second bonding layer 56, the support substrate 55, the back surface electrode 57, a first through-electrode 58a, a second through-electrode 58b, and a third through-electrode 58c.

The first stacked body 10, the second stacked body 20, the first light-transmissive electrode 41, the first interconnect electrode 46, the reflecting electrode 51, and the support substrate 55 are similar to those described above in regard to FIG. 1A to FIG. 2C. A detailed description of these components is omitted as appropriate.

Figure 7A:
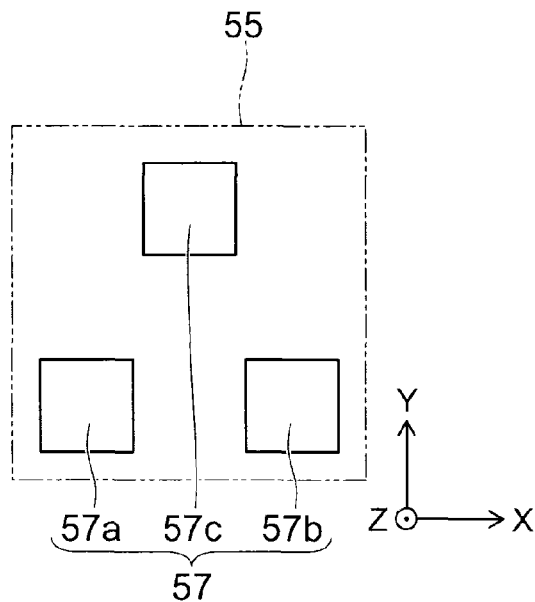
FIG. 7A to FIG. 7D are schematic plan views showing components of the semiconductor light emitting device according to the first embodiment.
Figure 7B:
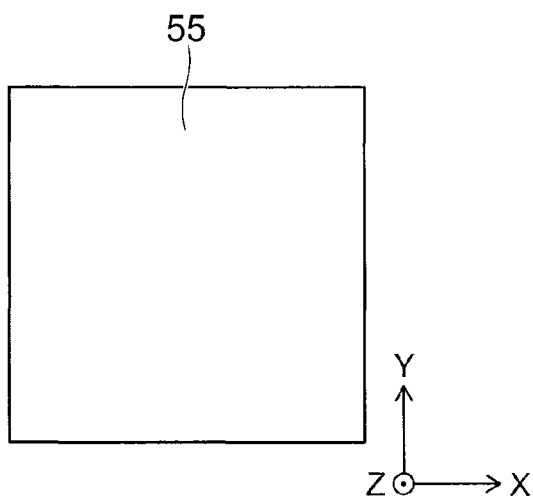

In the semiconductor light emitting device 112 according to the embodiment as shown in FIG. 6B, FIG. 6C, and FIG. 7A, the back surface electrode 57 includes a first back surface pad 57a, a second back surface pad 57b, and a third back surface pad 57c. The first back surface pad 57a is separated from the second back surface pad 57b on the first support substrate surface 55s. The first back surface pad 57a is separated from the third back surface pad 57c on the first support substrate surface 55s. The second back surface pad 57b is separated from the third back surface pad 57c on the first support substrate surface 55s. The other disposition methods of the back surface electrode 57 are similar to those described above in regard to FIG. 2A to FIG. 2C.

Figure 7C:
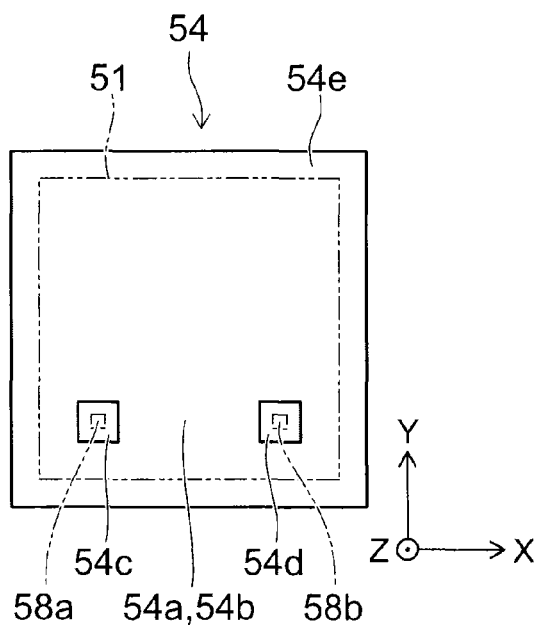
Figure 7D:
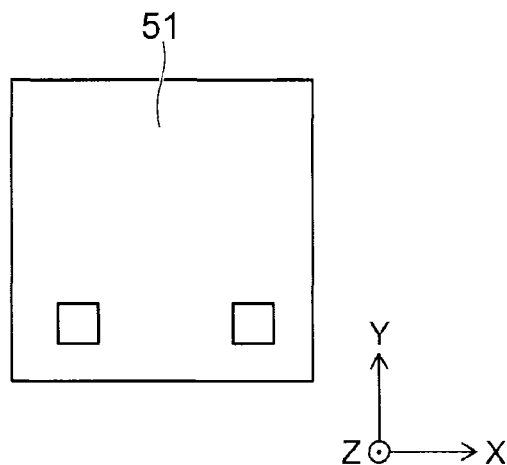
Figure 8A:
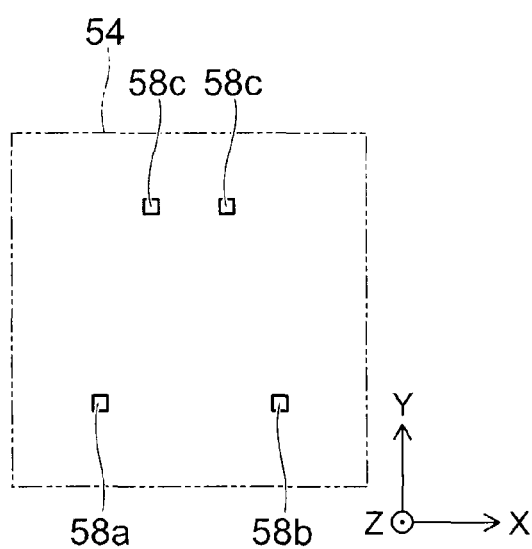
FIG. 8A to FIG. 8D are schematic plan views showing other components of the semiconductor light emitting device according to the first embodiment.
Figure 8B:
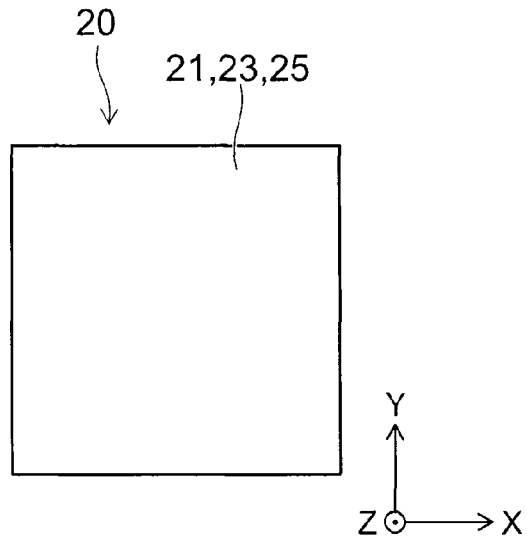
Figure 8C:
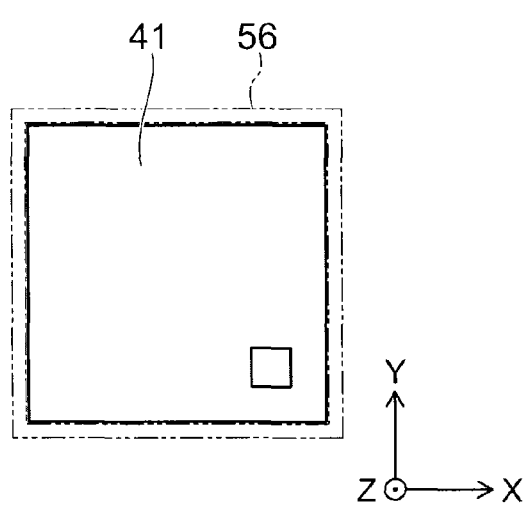
Figure 8D:
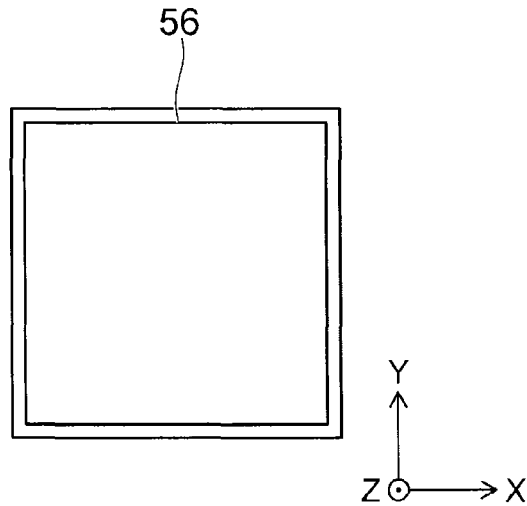

As shown in FIG. 6C and FIG. 7C, the first bonding layer 54 includes a first bonding portion 54a, a second bonding portion 54b, a first insulating layer 54c, a second insulating layer 54d, and a third insulating layer 54e. The first bonding layer 54 includes, for example, $SiO_2$.

As shown in FIG. 6B and FIG. 6C, the second bonding layer 56 includes a third bonding portion 56a and a fourth bonding portion 56b. The first through-electrode 58a includes a first through-electrode portion 58aa and a second through-electrode portion 58ab. The second through-electrode 58b includes a third through-electrode portion 58ba, a fourth through-electrode portion 58bb, and a fifth through-electrode portion 58bc. The third through-electrode 58c includes a sixth through-electrode portion 58ca and a seventh through-electrode portion 58cb.

The first through-electrode 58a pierces the support substrate 55, the reflecting electrode 51, the fourth semiconductor layer 23, and the second light emitting layer 25 in the first direction (in the example, the Z-axis direction). The first through-electrode 58a is electrically connected to the second semiconductor layer 13 and the third semiconductor layer 21. The first through-electrode 58a is electrically connected to the first back surface pad 57a.

The second through-electrode 58b pierces the support substrate 55, the second stacked body 20 (the fourth semiconductor layer 23, the second light emitting layer 25, and the third semiconductor layer 21), the first light-transmissive electrode 41, the second semiconductor layer 13, and the first light emitting layer 15 in the first direction. The second through-electrode 58b is electrically connected to the first semiconductor layer 11. The second through-electrode 58b is electrically connected to the second back surface pad 57b.

The third through-electrode 58c pierces the support substrate 55, the first bonding portion 54a, and the second bonding portion 54b. The third through-electrode 58c is electrically connected to the reflecting electrode 51. The third through-electrode 58c is electrically connected to the third back surface pad 57c.

The first insulating layer 54c is provided between the first through-electrode 58a and the reflecting electrode 51, between the first through-electrode 58a and the fourth semiconductor layer 23, and between the first through-electrode 58a and the second light emitting layer 25. The first insulating layer 54c prevents shorts between the third semiconductor layer 21 and the fourth semiconductor layer 23.

The second insulating layer 54d is provided between the second through-electrode 58b and the reflecting electrode 51, between the second through-electrode 58b and the second stacked body 20 (the fourth semiconductor layer 23, the second light emitting layer 25, and the third semiconductor layer 21), between the second through-electrode 58b and the first light-transmissive electrode 41, between the second through-electrode 58b and the second semiconductor layer 13, and between the second through-electrode 58b and the first light emitting layer 15. The second insulating layer 54d prevents shorts between the third semiconductor layer 21 and the fourth semiconductor layer 23. The second insulating layer 54d prevents shorts between the second through-electrode 58b and the second stacked body 20.

As shown in FIG. 6B, FIG. 6C, FIG. 8C, and FIG. 8D, the second bonding layer 56 is provided around the first light-transmissive electrode 41. The second bonding layer 56 includes, for example, $SiO_2$.

As shown in FIG. 6B and FIG. 6C, the second interconnect electrode 47 is separated from the first interconnect electrode 46 in the first direction. The first light emitting layer 15 is disposed between the second interconnect electrode 47 and the second semiconductor layer 13.

As shown in FIG. 9A and FIG. 9C, at least a portion of the first interconnect region 46a that is formed by projecting the first interconnect electrode 46 onto the plane perpendicular to the first direction (in the example, the Z-axis direction) overlaps a second interconnect region 47a formed by projecting the second interconnect electrode 47 onto the plane perpendicular to the first direction. In other words, in the first direction, at least a portion of the first interconnect electrode 46 overlaps the second interconnect electrode 47.

An example of a method for manufacturing the semiconductor light emitting device 112 shown in FIG. 6A to FIG. 6C will now be described.

SiO$_2$ is formed with a thickness of, for example, 1000 nm on the surface (a second support substrate surface 55t) of the support substrate 55 of undoped silicon (Si) (referring to FIG. 6B and FIG. 6C). The SiO$_2$ is used to form a portion of the first bonding portion 54a. For example, ECR sputtering or plasma CVD may be used as the method for forming the first bonding portion 54a. In ECR sputtering and plasma CVD, high layer quality is obtained at a low temperature. In plasma CVD, the coverability of the material is relatively good. Therefore, in the case where relatively large stepped portions exist, the occurrence of voids can be suppressed.

A second portion (the second through-electrode portion 58ab) of the first through-electrode 58a, a third portion (the fifth through-electrode portion 58bc) of the second through-electrode 58b, and a second portion (the seventh through-electrode portion 58cb) of the third through-electrode 58c are formed. For example, through-silicon via (TSV) technology may be used. The second through-electrode portion 58ab pierces the SiO$_2$ and the support substrate 55 in the first direction. The fifth through-electrode portion 58bc pierces the SiO$_2$ and the support substrate 55 in the first direction. The seventh through-electrode portion 58cb pierces the SiO$_2$ and the support substrate 55 in the first direction. An insulating film may be formed between the support substrate 55 and the through-electrode portions to reliably insulate the support substrate 55 from the through-electrode portions.

Ti/Pt/Au is formed with a thickness of, for example, 800 nm on the first support substrate surface 55s of the support substrate 55. Thereby, the first back surface pad 57a, the second back surface pad 57b, and the third back surface pad 57c are formed. The first back surface pad 57a is electrically connected to the second through-electrode portion 58ab. The second back surface pad 57b is electrically connected to the fifth through-electrode portion 58bc. The third back surface pad 57c is electrically connected to the seventh through-electrode portion 58cb.

For example, in the case where the size of the semiconductor light emitting device 112 when projected onto the plane perpendicular to the first direction is 1 mm by 1 mm, the sizes of the first back surface pad 57a, the second back surface pad 57b, and the third back surface pad 57c are, for example, not less than about 100 nm by 100 nm and not more than about 400 nm by 400 nm. When projected onto the plane perpendicular to the first direction, the first back surface pad 57a, the second back surface pad 57b, and the third back surface pad 57c may be, for example, rectangles, circles, fan-like shapes, of combinations of these configurations.

The first bonding portion 54a is planarized by CMP. At this time, the second through-electrode portion 58ab, the fifth through-electrode portion 58bc, and the seventh through-electrode portion 58cb are exposed. In the case where relatively large stepped portions exist, it is necessary for the SiO$_2$ to be thicker when the first bonding portion 54a is planarized by CMP. For example, SiO$_2$ having a thickness that is three times the thickness of the stepped portions is necessary. Prior to the CMP, the thickness of the SiO$_2$ that is necessary for the planarization can be thinner by making a pseudo-flat state by reducing the stepped portions of the SiO$_2$ by dry etching, etc. Also, the planarization can be performed easily in the state in which the metal and the SiO$_2$ coexist by changing the slurry to adjust the selectivity between the metal and the SiO$_2$.

The second crystal layer that includes the second stacked body 20 in which the third semiconductor layer 21, the second light emitting layer 25, and the fourth semiconductor layer 23 are provided in this order is grown on a growth substrate (e.g., a sapphire substrate, a silicon (Si) substrate, etc.) by MOCVD. Thereby, the second semiconductor wafer is made. The second light emitting layer 25 emits the second light L2 of the second peak wavelength.

SiO$_2$ is formed with a thickness of 400 nm on the second crystal layer (in the example, on the fourth semiconductor layer 23). The SiO$_2$ is used to form a portion of the third insulating layer 54e.

Silver (Ag) is formed with a thickness of 200 nm on the fourth semiconductor layer 23 from which the SiO$_2$ is removed by lift-off; and heat treatment is performed. Thereby, the reflecting electrode 51 is formed on the fourth semiconductor layer 23.

A metal layer (TiW 50 nm/Pt 100 nm/Au 1000 nm/Ti 50 nm) may be formed on substantially the entire fourth semiconductor layer surface 23s of the fourth semiconductor layer 23 (referring to FIG. 6B). Thereby, the reflecting electrode 51 may be covered with the metal layer (TiW 50 nm/Pt 100 nm/Au 1000 nm/Ti 50 nm). The metal layer (TiW 50 nm/Pt 100 nm/Au 1000 nm/Ti 50 nm) can spread the current to a relatively wide region of the fourth semiconductor layer 23. Thereby, the effective light emitting region increases. The operating voltage decreases.

A portion of the reflecting electrode 51, the fourth semiconductor layer 23, and the second light emitting layer 25 is removed by dry etching. Thereby, a first hole is made to expose the third semiconductor layer 21. The depth (the length in the Z-axis direction) of the first hole is, for example, about 1000 nm. The inner wall of the first hole may extend in a direction (the Z-axis direction) perpendicular to the XY plane. The inner wall of the first hole may extend in a direction that is tilted with respect to the Z-axis direction. In other words, the inner wall of the first hole may be formed in a tapered configuration.

In the case where the inner wall of the first hole extends in the direction perpendicular to the XY plane, the surface area occupied by the first hole can be minimized. Therefore, the light emission surface area can be increased.

In the case where the inner wall of the first hole is made in a tapered configuration, the coverage of the first insulating layer 54c and the coverage of the second insulating layer 54d improve.

The inner diameter of the first hole is, for example, not less than about 1 μm and not more than about 100 μm. It is favorable for the inner diameter of the first hole to be not less than about 5 μm and not more than about 20 μm.

In the case where the inner diameter of the first hole is relatively small, the surface area of the second light emitting layer 25 can be relatively greater. The light emitting region can be enlarged. The luminous efficiency increases. The operating voltage decreases.

In the case where the inner diameter of the first hole is relatively large, the first through-electrode 58a can be formed with a relatively large diameter.

A portion of the reflecting electrode 51, the fourth semiconductor layer 23, the second light emitting layer 25, and the third semiconductor layer 21 is removed by dry etching. Thereby, a second hole is made to expose the growth substrate. The depth (the length in the Z-axis direction) of the second hole is, for example, about 5000 nm.

A dielectric (e.g., SiO$_2$) is formed with a thickness of 1000 nm on the entire surface of the reflecting electrode 51, the exposed fourth semiconductor layer 23, the exposed second light emitting layer 25, the exposed third semiconductor layer 21, and the growth substrate. Thereby, the first insulating layer 54c and the second insulating layer 54d are formed. The first insulating layer 54c prevents shorts between the third semiconductor layer 21 and the fourth semiconductor layer 23. The second insulating layer 54d prevents shorts between the third semiconductor layer 21 and the fourth semiconductor layer 23. The second insulating layer 54d prevents shorts between the fourth through-electrode portion 58bb and the second stacked body 20. The SiO$_2$ that is on the fourth semiconductor layer 23 is used to form a portion of the second bonding portion 54b.

The third semiconductor layer 21 is exposed by removing the SiO$_2$ at the bottom of the first hole. Al/Ti is formed with a thickness of 200 nm on the exposed third semiconductor layer 21. Thereby, a first end portion electrode 58d (referring to FIG. 6C) is formed. The thickness (the length in the Z-axis direction) of the first end portion electrode 58d is, for example, not less than about 10 nm and not more than about 10000 nm. It is favorable for the thickness of the first end portion electrode 58d to be not less than about 50 nm and not more than about 1000 nm. The material of the first end portion electrode 58d is not limited to Al/Ti; and it is sufficient for the material of the first end portion electrode 58d to be a material that has an ohmic contact with the third semiconductor layer 21. The first end portion electrode 58d has a single-layer structure. The first end portion electrode 58d may have a structure in which different metals are stacked.

The first hole is filled with aluminum (Al). Thereby, a first portion (the first through-electrode portion 58aa) of the first through-electrode 58a is formed. The second hole is filled with aluminum (Al). Thereby, a second portion (the fourth through-electrode portion 58bb) of the second through-electrode 58b is formed. A portion of the SiO$_2$ that is on the reflecting electrode 51 is removed. Thereby, the reflecting electrode 51 is exposed. The first portion (the sixth through-electrode portion 58ca) of the third through-electrode 58c is formed on the exposed reflecting electrode 51.

The method for forming the first through-electrode portion 58aa, the fourth through-electrode portion 58bb, and the sixth through-electrode portion 58ca may be lift-off combined with vapor deposition, sputtering, CVD, plating, or a combination of such methods. For example, copper (Cu) may be formed by electroless plating. In such a case, a layer of copper (Cu) or a layer of gold (Au) maybe formed in the first hole and the second hole as a seed layer. Seed layer enhancement may be performed as plating seed layer extension technology. For example, tungsten (W) may be formed by CVD.

The materials of the first through-electrode portion 58aa, the fourth through-electrode portion 58bb, and the sixth through-electrode portion 58ca may be one metal selected from the group consisting of Cu, Ag, Ni, Ti, Au, W, and Al or an alloy including at least one selected from the group consisting of Cu, Ag, Ni, Ti, Au, W, and Al. The materials of the first through-electrode portion 58aa, the fourth through-electrode portion 58bb, and the sixth through-electrode portion 58ca may be metals having a relatively low resistivity to allow a large current to flow. Thereby, a relatively large current can flow in the first through-electrode portion 58aa, the fourth through-electrode portion 58bb, and the sixth through-electrode portion 58ca. The materials of the first through-electrode portion 58aa, the fourth through-electrode portion 58bb, and the sixth through-electrode portion 58ca may be metals having a high reflectance for the emitted light. Thereby, the light extraction efficiency increases.

The second bonding portion 54b is formed on the reflecting electrode 51. For example, the material of the second bonding portion 54b is SiO$_2$. The thickness of the second bonding portion 54b is, for example, not less than about 100 nm and not more than about 10000 nm. For example, ECR sputtering or plasma CVD may be used as the method for forming the second bonding portion 54b. In ECR sputtering and plasma CVD, high layer quality is obtained at a low temperature. In plasma CVD, the coverability of the material is relatively good. Therefore, in the case where relatively large stepped portions exist, the occurrence of voids can be suppressed.

The second bonding portion 54b is planarized by CMP. At this time, the first through-electrode portion 58aa, the fourth through-electrode portion 58bb, and the sixth through-electrode portion 58ca are exposed.

It is favorable to use a slurry in which the etching rate ratio between the SiO$_2$ and the first through-electrode portion 58aa, the fourth through-electrode portion 58bb, and the sixth through-electrode portion 58ca is adjusted to simultaneously planarize the SiO$_2$ and the first through-electrode portion 58aa, the fourth through-electrode portion 58bb, and the sixth through-electrode portion 58ca by CMP. After the planarization, the first through-electrode portion 58aa, the fourth through-electrode portion 58bb, and the sixth through-electrode portion 58ca can be caused to jut slightly by gently polishing using a slurry for which the etching rates of the materials of the first through-electrode portion 58aa, the fourth through-electrode portion 58bb, and the sixth through-electrode portion 58ca are slow.

Similar processing is performed for the second through-electrode portion 58ab, the fifth through-electrode portion 58bc, and the seventh through-electrode portion 58cb on the support substrate 55. The first through-electrode portion 58aa and the second through-electrode portion 58ab are brought into contact and bonded. The fourth through-electrode portion 58bb and the fifth through-electrode portion 58bc are brought into contact and bonded. The sixth through-electrode portion 58ca and the seventh through-electrode portion 58cb are brought into contact and bonded. The metal is ductile and is mashed by the compressive stress. Thereby, the SiO$_2$ can be bonded; and the first through-electrode portion 58aa and the second through-electrode portion 58ab can be electrically connected with good yield. The fourth through-electrode portion 58bb and the fifth through-electrode portion 58bc can be electrically connected with good yield. The sixth through-electrode portion 58ca and the seventh through-electrode portion 58cb can be electrically connected with good yield.

A method for forming the electrical connections between the first through-electrode portion 58aa and the second through-electrode portion 58ab, between the fourth through-electrode portion 58bb and the fifth through-electrode portion 58bc, and between the sixth through-electrode portion 58ca and the seventh through-electrode portion 58cb may utilize a metal having a relatively high coefficient of thermal expansion. After the CMP, the bonding is performed and the first through-electrode portion 58aa, the second through-electrode portion 58ab, the fourth through-electrode portion 58bb, the fifth through-electrode portion 58bc, the sixth through-electrode portion 58ca, and the seventh through-electrode portion 58cb are caused to expand by performing heat treatment at about 350° C. Thereby, reliable electrical connections are obtained.

The first bonding portion 54a on which CMP was performed is directly bonded to the second bonding portion 54b on which CMP was performed. Plasma cleaning by an oxygen atmosphere is performed in a vacuum. The support substrate 55 and the second semiconductor wafer are bonded by applying a pressure of 1 kN at 150° C. At this time, alignment between the first through-electrode portion 58aa and the second through-electrode portion 58ab, alignment between the fourth through-electrode portion 58bb and the fifth through-electrode portion 58bc, and alignment between the sixth through-electrode portion 58*ca* and the seventh through-electrode portion 58*cb* are performed. Thereby, electrical connections are formed between the first through-electrode portion 58*aa* and the second through-electrode portion 58*ab*, between the fourth through-electrode portion 58*bb* and the fifth through-electrode portion 58*bc*, and between the sixth through-electrode portion 58*ca* and the seventh through-electrode portion 58*cb*.

The growth substrate is removed. In the case where the growth substrate is a sapphire substrate, the growth substrate is removed by LLO. In the case where the growth substrate is a silicon substrate, the growth substrate is removed by dry etching, etc.

Dry etching of the exposed second crystal layer is performed. Thereby, the third semiconductor layer 21 and the fourth through-electrode portion 58*bb* are exposed.

A light-transmissive electrode (e.g., ITO, etc.) is formed with a thickness of 500 nm on the exposed third semiconductor layer 21 and the exposed fourth through-electrode portion 58*bb*; and heat treatment is performed. Thereby, an ohmic electrode for the third semiconductor layer 21 is formed. The ohmic electrode is used to form a portion of the second transmissive electrode portion 41*b*. The ohmic electrode is patterned such that the peripheral portion of the ohmic electrode has substantially the same shape as the peripheral portion of the reflecting electrode 51 when projected onto the plane perpendicular to the first direction (in the example, the Z-axis direction). Thereby, the second transmissive electrode portion 41*b* is formed. At this time, the light-transmissive electrode that is on the fourth through-electrode portion 58*bb* is removed. Thereby, the fourth through-electrode portion 58*bb* is exposed.

SiO$_2$ is formed with a thickness of 400 nm on the third semiconductor layer 21 and on the second transmissive electrode portion 41*b*. The SiO$_2$ is used to form an insulating unit that insulates the second transmissive electrode portion 41*b* from the fourth through-electrode portion 58*bb*. The SiO$_2$ that is on the fourth through-electrode portion 58*bb* is removed. Thereby, the fourth through-electrode portion 58*bb* is exposed. A metal is formed on the exposed second through-electrode 58*b* to extend the second through-electrode 58*b* in the first direction. The method for forming the metal on the second through-electrode 58*b* is as described above.

The fourth bonding portion 56*b* is formed on the third semiconductor layer 21. The fourth bonding portion 56*b* includes, for example, SiO$_2$. The thickness of the fourth bonding portion 56*b* is, for example, not less than about 100 nm and not more than about 10000 nm. It is favorable for the thickness of the fourth bonding portion 56*b* to be, for example, about 1000 nm. The fourth bonding portion 56*b* is planarized by CMP. At this time, the fourth through-electrode portion 58*bb* and the second transmissive electrode portion 41*b* are exposed.

The first crystal layer that includes the first stacked body 10 in which the first semiconductor layer 11, the first light emitting layer 15, and the second semiconductor layer 13 are provided in this order is grown on a growth substrate (e.g., a sapphire substrate, a silicon (Si) substrate, etc.) by MOCVD. Thereby, the first semiconductor wafer is made. The first light emitting layer 15 emits the first light L1 of the first peak wavelength that is different from the second peak wavelength. The first peak wavelength may be longer than the second peak wavelength or shorter than the second peak wavelength. Compared to the case where the first peak wavelength is longer than the second peak wavelength, the first light emitting layer 15 does not easily absorb the second light L2 emitted from the second light emitting layer 25 when the first peak wavelength is shorter than the second peak wavelength. Thereby, the light extraction efficiency of the semiconductor light emitting device 111 increases.

Al/Ni/Au/Ti is formed with a thickness of 500 nm on the first crystal layer (in the example, on the second semiconductor layer 13) by lift-off. Thereby, the first interconnect electrode 46 of the second semiconductor layer 13 is formed. The first interconnect electrode 46 is formed to improve the current spreading properties. The degree of the current spreading is a result of the resistivity of the light-transmissive electrode. By forming the first interconnect electrode 46, the current can be spread to a relatively wide region of the second semiconductor layer 13.

The first interconnect electrode 46 may have a non-ohmic contact with the second semiconductor layer 13. The first interconnect electrode width W1 (referring to FIG. 9A) is, for example, about 10 μm. In the case where the semiconductor light emitting device 112 is small, the first interconnect electrode 46 may not be formed. The thickness (the length in the Z-axis direction) of the first interconnect electrode 46 is, for example, not less than about 10 nm and not more than about 10000 nm. It is favorable for the thickness of the first interconnect electrode 46 to be not less than about 50 nm and not more than about 1000 nm.

In the case where the thickness of the first interconnect electrode 46 is relatively thin, the stepped portions are relatively small in the planarization of the CMP process. Therefore, the polishing amount that is necessary is small. The cost decreases because the thickness (the length in the Z-axis direction) of the third bonding portion 56*a* is thinner and the processing time is reduced. In the case where the thickness of the first interconnect electrode 46 is relatively thick, the interconnect resistance of the first interconnect electrode 46 is relatively low. Therefore, the current spreading increases. The effective light emitting region increases. The luminous efficiency increases. The operating voltage decreases.

A light-transmissive electrode (e.g., ITO, etc.) is formed with a thickness of 500 nm on substantially the entire second semiconductor layer 13. Thereby, the first interconnect electrode 46 is covered with the light-transmissive electrode. The light-transmissive electrode is patterned to have substantially the same configuration as when the first transmissive electrode portion 41*a* is bonded to the second transmissive electrode portion 41*b*. Heat treatment is performed; and the first transmissive electrode portion 41*a* is formed.

A portion of the first transmissive electrode portion 41*a*, the second semiconductor layer 13, and the first light emitting layer 15 is removed by dry etching. Thereby, a third hole is made to expose the first semiconductor layer 11. The depth (the length in the Z-axis direction) of the third hole is, for example, about 1000 nm. The inner wall of the third hole may extend in a direction (the Z-axis direction) perpendicular to the XY plane. The inner wall of the third hole may extend in a direction tilted with respect to the Z-axis direction. In other words, the inner wall of the third hole may be formed in a tapered configuration.

In the case where the inner wall of the third hole extends in the direction perpendicular to the XY plane, the surface area occupied by the third hole can be minimized. Therefore, the light emission surface area can be increased.

In the case where the inner wall of the third hole is made in a tapered configuration, the coverage of the second insulating layer 54*d* improves.

The inner diameter of the third hole is, for example, not less than about 1 μm and not more than about 100 μm. It is favorable for the inner diameter of the third hole to be not less than about 5 μm and not more than about 20 μm.

In the case where the inner diameter of the third hole is relatively small, the surface area of the first light emitting layer 15 can be relatively greater. The light emitting region can be enlarged. The luminous efficiency increases. The operating voltage decreases.

In the case where the inner diameter of the third hole is relatively large, the second through-electrode 58b can be formed with a relatively large diameter.

A dielectric (e.g., $SiO_2$) is formed with a thickness of 1000 nm on the entire surface of the first transmissive electrode portion 41a, the exposed second semiconductor layer 13, the exposed first light emitting layer 15, and the exposed first semiconductor layer 11. Thereby, the third bonding portion 56a and the second insulating layer 54d are formed. The second insulating layer 54d prevents shorts between the first semiconductor layer 11 and the second semiconductor layer 13. The $SiO_2$ that is on the second semiconductor layer 13 is used to form a portion of the third bonding portion 56a.

The first semiconductor layer 11 is exposed by removing the $SiO_2$ at the bottom of the third hole. Al/Ti is formed with a thickness of 200 nm on the exposed first semiconductor layer 11. Thereby, a second end portion electrode 58e (referring to FIG. 6C) is formed. The thickness (the length in the Z-axis direction) of the second end portion electrode 58e is, for example, not less than about 10 nm and not more than about 10000 nm. It is favorable for the thickness of the second end portion electrode 58e to be not less than about 50 nm and not more than about 1000 nm. The material of the second end portion electrode 58e is not limited to Al/Ti; and it is sufficient for the material of the second end portion electrode 58e to be a material that has an ohmic contact with the first semiconductor layer 11. The second end portion electrode 58e has a single-layer structure. The second end portion electrode 58e may have a structure in which different metals are stacked.

The third hole is filled with aluminum (Al). Thereby, a first portion (the third through-electrode portion 58ba) of the second through-electrode 58b is formed. The method for forming the third through-electrode portion 58ba is as described above in regard to the first through-electrode portion 58aa, the fourth through-electrode portion 58bb, and the sixth through-electrode portion 58ca.

The third bonding portion 56a is planarized by CMP. At this time, the third through-electrode portion 58ba and the first transmissive electrode portion 41a are exposed.

The third bonding portion 56a on which CMP was performed is directly bonded to the fourth bonding portion 56b on which CMP was performed. Simultaneously, the first transmissive electrode portion 41a on which CMP was performed is directly bonded to the second transmissive electrode portion 41b on which CMP was performed. Plasma cleaning by an oxygen atmosphere is performed in a vacuum. The first semiconductor wafer and the second semiconductor wafer are bonded by applying a pressure of 1 kN at 150° C. At this time, alignment between the third through-electrode portion 58ba and the fourth through-electrode portion 58bb is performed. Thereby, an electrical connection is formed between the third through-electrode portion 58ba and the fourth through-electrode portion 58bb.

The growth substrate is removed. In the case where the growth substrate is a sapphire substrate, the growth substrate is removed by LLO. In the case where the growth substrate is a silicon substrate, the growth substrate is removed by dry etching, etc.

Dry etching of the exposed first crystal layer is performed. Thereby, the first semiconductor layer 11 is exposed.

Al/Ni/Au is formed with a thickness of 1000 nm on the exposed first semiconductor layer 11 by lift-off. Thereby, the second interconnect electrode 47 is formed. The thickness (the length in the Z-axis direction) of the second interconnect electrode 47 is, for example, not less than about 100 nm and not more than about 10000 nm. In the case where the thickness of the second interconnect electrode 47 is relatively thick, the interconnect resistance of the second interconnect electrode 47 is relatively lower. Therefore, the current can be spread better.

At least a portion of the first interconnect electrode 46 overlaps the second interconnect electrode 47 when projected onto the plane perpendicular to the first direction (in the example, the Z-axis direction). A portion of the second light that is emitted from the second light emitting layer 25 is blocked by the first interconnect electrode 46 and is not extracted easily directly above the first interconnect electrode 46. Conversely, according to the embodiment, the second light that is emitted from the second light emitting layer 25 is not easily blocked by the second interconnect electrode 47 because, in the first direction, at least a portion of the first interconnect electrode 46 overlaps the second interconnect electrode 47. Therefore, the light extraction efficiency increases. Uneven color can be reduced.

The semiconductor light emitting device 112 is formed by singulation by dicing, etc.

In the first direction, the first through-electrode 58a may overlap the first interconnect electrode 46. In the first direction, the first through-electrode 58a may overlap the second interconnect electrode 47. In the first direction, the second through-electrode 58b may overlap the first interconnect electrode 46. In the first direction, the second through-electrode 58b may overlap the second interconnect electrode 47. Thereby, the reduction of the light emitting region that occurs when a new through-electrode is provided can be suppressed. The light extraction efficiency increases. Color breakup can be reduced.

Multiple through-electrodes may be connected to the semiconductor layers (e.g., the first semiconductor layer 11, etc.). The spread of the current can be improved by providing current paths in multiple locations of the surface. The light output increases. The operating voltage can be reduced. The through-electrodes in the multiple locations may be electrically connected inside the support substrate 55 or inside the bonding layer (e.g., the first bonding layer 54). The assembly process can be simplified by combining the back surface pads (in the example, the first back surface pad 57a, the second back surface pad 57b, and the third back surface pad 57c) into one pad. The yield increases.

The first through-electrode 58a may contact the first light-transmissive electrode 41 instead of the third semiconductor layer 21. The first through-electrode 58a may be formed outside (around) the semiconductor light emitting device 112. The second through-electrode 58b may be formed outside (around) the semiconductor light emitting device 112. The third through-electrode 58c may be formed outside (around) the semiconductor light emitting device 112.

FIG. 10A to FIG. 10D are schematic views showing another semiconductor light emitting device according to the first embodiment.

Figure 11A:
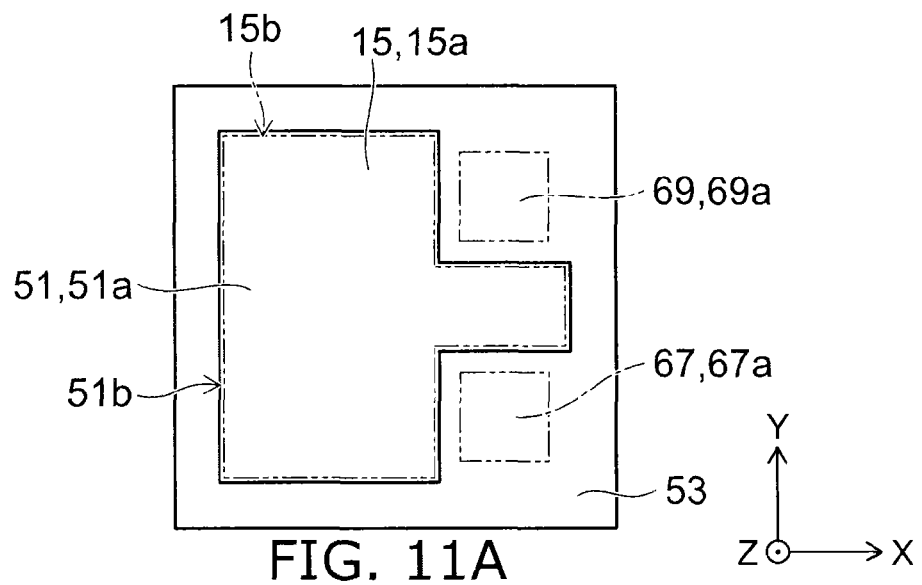
FIG. 11A to FIG. 11C are schematic plan views showing components of the semiconductor light emitting device according to the first embodiment.
Figure 11B:
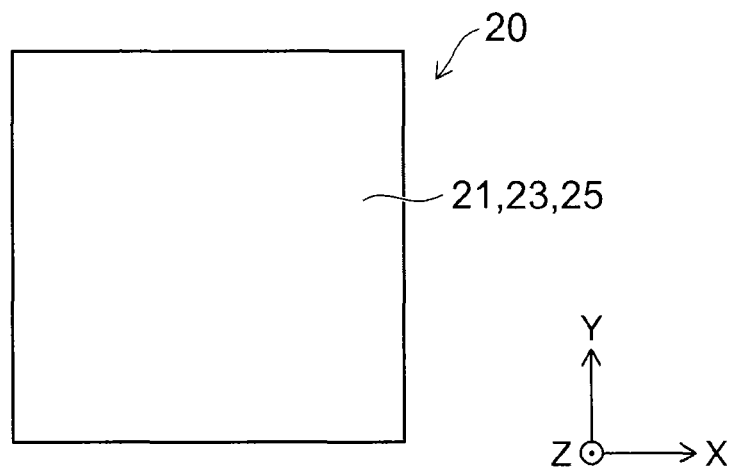
Figure 11C:
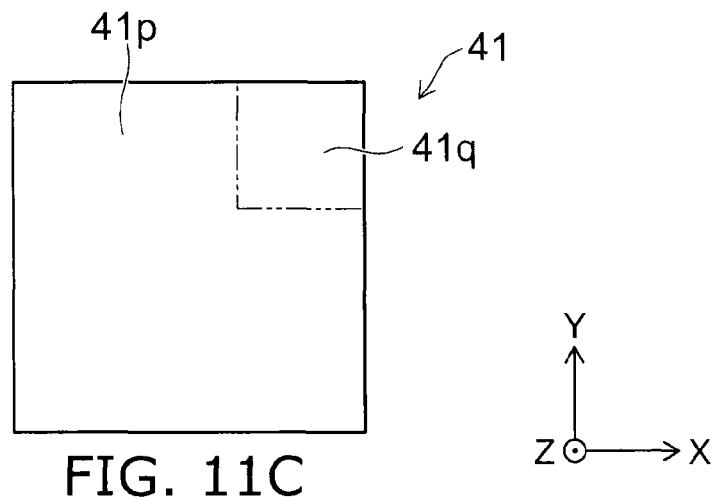

FIG. 11A to FIG. 11C are schematic plan views showing components of the semiconductor light emitting device according to the first embodiment.

FIG. 12A to FIG. 12D are schematic plan views showing other components of the semiconductor light emitting device according to the first embodiment.

FIG. 13A to FIG. 13D are schematic plan views showing other components of the semiconductor light emitting device according to the first embodiment.

Figure 10A:
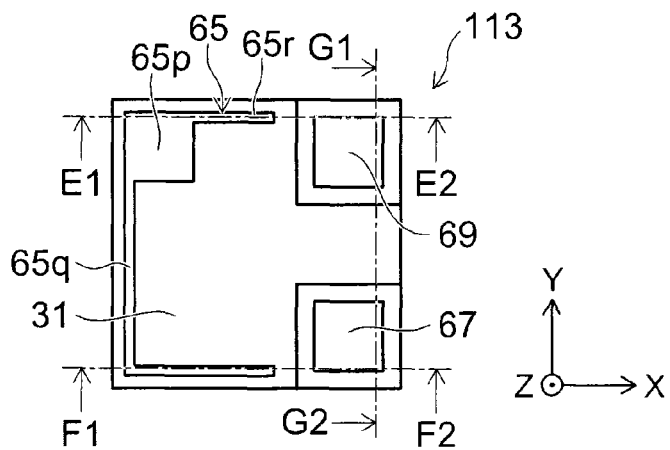
FIG. 10A to FIG. 10D are schematic views showing another semiconductor light emitting device according to the first embodiment.
Figure 10B:
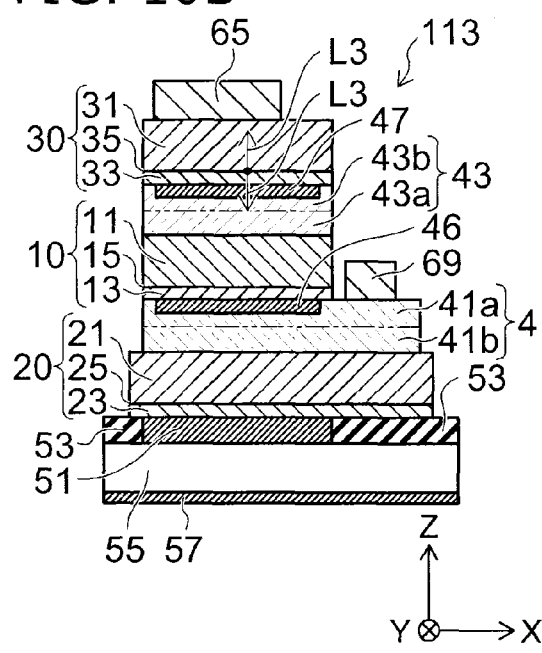
Figure 10C:
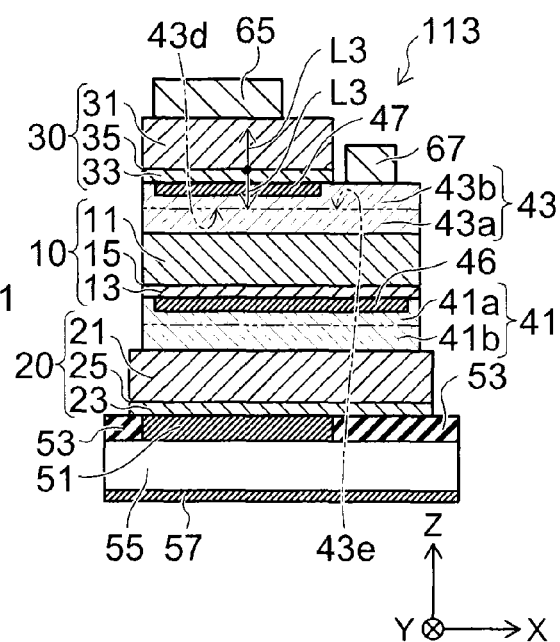
Figure 10D:
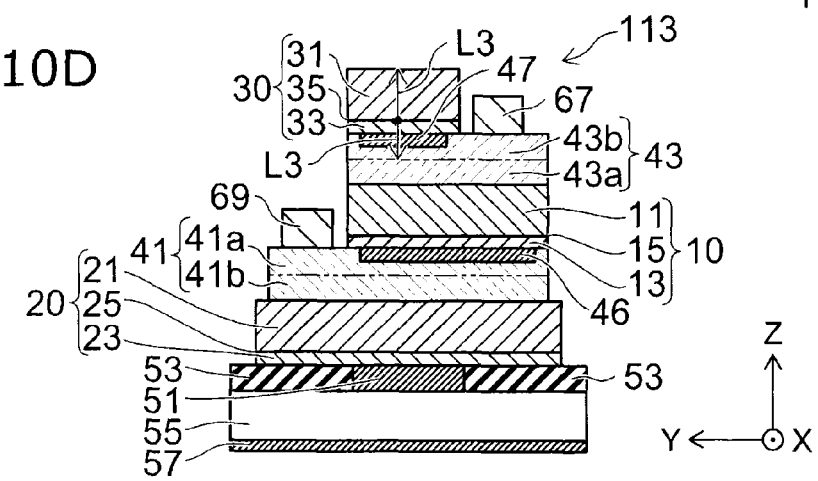

FIG. 10A is a schematic plan view showing the semiconductor light emitting device according to the first embodiment. FIG. 10B is a cross-sectional view along line E1-E2 of FIG. 10A. FIG. 10C is a cross-sectional view along line F1-F2 of FIG. 10A. FIG. 10D is a cross-sectional view along line G1-G2 of FIG. 10A.

The semiconductor light emitting device 113 shown in FIG. 10A to FIG. 10D includes the semiconductor light emitting device 111 shown in FIG. 2A to FIG. 2C and further includes a third stacked body 30, a second light-transmissive electrode 43, and the second interconnect electrode 47. Instead of the first electrode 61 (e.g., referring to FIG. 2A) and the second electrode 63 (e.g., referring to FIG. 2A), the semiconductor light emitting device 113 includes a third electrode 65, a fourth electrode 67, and a fifth electrode 69.

The first stacked body 10, the second stacked body 20, the reflecting electrode 51, and the support substrate 55 are similar to those described above in regard to FIG. 1A to FIG. 2C. A detailed description of these components is omitted as appropriate.

The third stacked body 30 includes a fifth semiconductor layer 31, a sixth semiconductor layer 33, and a third light emitting layer 35. The fifth semiconductor layer 31 has a fifth conductivity type. The sixth semiconductor layer 33 has a sixth conductivity type. The sixth conductivity type is different from the fifth conductivity type. For example, the fifth conductivity type is the n-type. For example, the sixth conductivity type is the p-type. The fifth conductivity type may be the p-type. The sixth conductivity type may be the n-type. In the following example, the fifth conductivity type is the n-type. In the following example, the sixth conductivity type is the p-type.

The fifth semiconductor layer 31 is separated from the first semiconductor layer 11 in the first direction (in the example, the Z-axis direction). The sixth semiconductor layer 33 is provided between the fifth semiconductor layer 31 and the first semiconductor layer 11. The third light emitting layer 35 is provided between the fifth semiconductor layer 31 and the sixth semiconductor layer 33. For example, as shown in FIG. 10B to FIG. 10D, the third light emitting layer 35 emits a third light L3. The third light has a third peak wavelength. The third peak wavelength is different from the first peak wavelength. The third peak wavelength is different from the second peak wavelength.

The second light-transmissive electrode 43 is provided between the first semiconductor layer 11 and the sixth semiconductor layer 33. As shown in FIG. 12D, the second light-transmissive electrode 43 has a third transmissive portion 43p and a fourth transmissive portion 43q. The third transmissive portion 43p is provided between the first semiconductor layer 11 and the sixth semiconductor layer 33. The fourth transmissive portion 43q is arranged with the third transmissive portion 43p in the plane perpendicular to the first direction. In other words, the fourth transmissive portion 43q is arranged with the third transmissive portion 43p in a direction perpendicular to the first direction.

The second light-transmissive electrode 43 has an ohmic contact with the first semiconductor layer 11. The second light-transmissive electrode 43 has an ohmic contact with the sixth semiconductor layer 33. The second light-transmissive electrode 43 transmits the first light L1 emitted by the first light emitting layer 15. The second light-transmissive electrode 43 transmits the second light L2 emitted by the second light emitting layer 25. The second light-transmissive electrode 43 transmits the third light L3 emitted by the third light emitting layer 35.

Figure 12A:
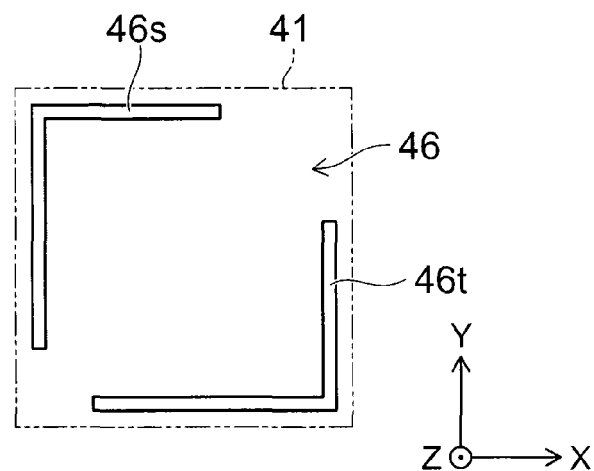
FIG. 12A to FIG. 12D are schematic plan views showing other components of the semiconductor light emitting device according to the first embodiment.

As shown in FIG. 12A, the first interconnect electrode 46 includes a first interconnect electrode portion 46s and a second interconnect electrode portion 46t.

Figure 13A:
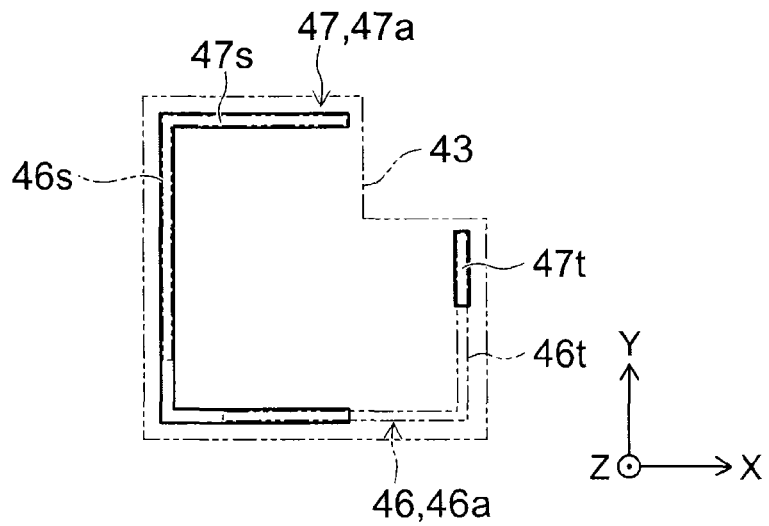
FIG. 13A to FIG. 13D are schematic plan views showing other components of the semiconductor light emitting device according to the first embodiment.

The second interconnect electrode 47 is provided between the first semiconductor layer 11 and the sixth semiconductor layer 33. The second interconnect electrode 47 is electrically connected to the second light-transmissive electrode 43. As shown in FIG. 13A, the second interconnect electrode 47 includes a third interconnect electrode portion 47s and a fourth interconnect electrode portion 47t.

As shown in FIG. 13A, at least a portion of the first interconnect region 46a that is formed by projecting the first interconnect electrode 46 onto the plane perpendicular to the first direction (in the example, the Z-axis direction) overlaps the second interconnect region 47a formed by projecting the second interconnect electrode 47 onto the plane perpendicular to the first direction. In other words, in the first direction, at least a portion of the first interconnect electrode 46 overlaps the second interconnect electrode 47. Thereby, uneven color can be reduced while increasing the light extraction efficiency.

Figure 13B:
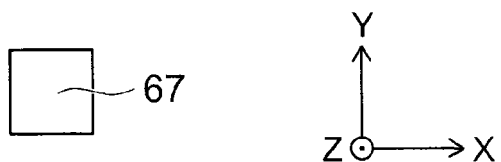

The fifth semiconductor layer 31 is disposed between the third electrode 65 and the third light emitting layer 35. The third electrode 65 is electrically connected to the fifth semiconductor layer 31. As shown in FIG. 10A and FIG. 13D, the third electrode 65 has a pad portion 65p, a first fine wire portion 65q, and a second fine wire portion 65r. The first fine wire portion 65q extends outward from the pad portion 65p with the pad portion 65p as a base portion. The second fine wire portion 65r extends outward from the pad portion 65p with the pad portion 65p as a base portion.

The fourth transmissive portion 43q is disposed between the fourth electrode 67 and the first semiconductor layer 11. The fourth electrode 67 is electrically connected to the first semiconductor layer 11. The fourth electrode 67 is electrically connected to the sixth semiconductor layer 33.

The second transmissive portion 41q (referring to FIG. 11C) is disposed between the fifth electrode 69 and the third semiconductor layer 21. The fifth electrode 69 is electrically connected to the second semiconductor layer 13. The fifth electrode 69 is electrically connected to the third semiconductor layer 21.

Figure 13C:
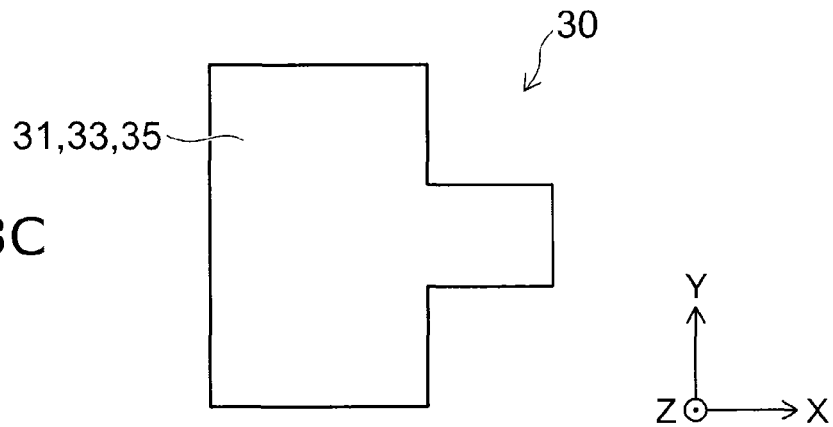
Figure 13D:
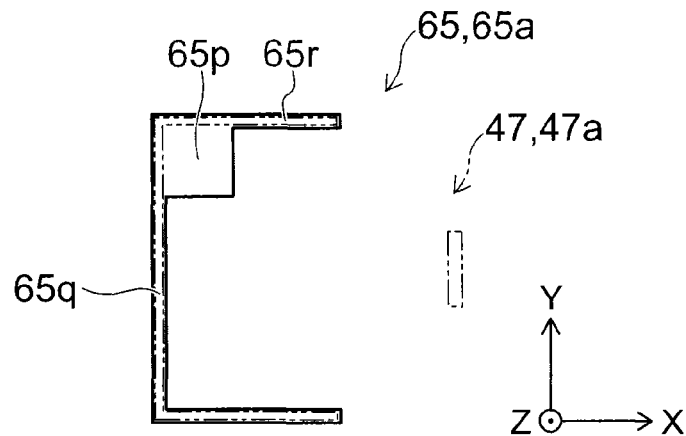

As shown in FIG. 11A and FIG. 13C, the outer edge (the first light emitting layer outer edge 15b) of the first light emitting layer region 15a that is formed by projecting the first light emitting layer 15 onto the plane perpendicular to the first direction (in the example, the Z-axis direction) is positioned inside the outer edge (the reflecting electrode outer edge 51b) of the reflecting electrode region 51a formed by projecting the reflecting electrode 51 onto the plane perpendicular to the first direction. In other words, in the first direction, the first light emitting layer 15 is positioned inside the reflecting electrode 51. In the first direction, the first light emitting layer 15 may be aligned with the reflecting electrode 51.

Thereby, the light extraction region (the first light extraction region 17 (referring to FIG. 1B)) of the first light emitting layer 15, the light extraction region (the second light extraction region 27 (referring to FIG. 1B)) of the second light emitting layer, and the light extraction region of the third light emitting layer 35 can be set to be substantially the same; and uneven color can be reduced while increasing the light extraction efficiency.

As shown in FIG. 11A and FIG. 13B, a fourth electrode region 67a that is formed by projecting the fourth electrode 67 onto the plane perpendicular to the first direction (in the example, the Z-axis direction) is separated from the reflecting electrode region 51a formed by projecting the reflecting electrode 51 onto the plane perpendicular to the first direction. In other words, the fourth electrode 67 is separated from the reflecting electrode 51 in a direction perpendicular to the first direction.

Thereby, the proportion of the light absorbed by the fourth electrode 67 can be reduced; and the light extraction efficiency can be increased.

Figure 12B:
Figure 12C:
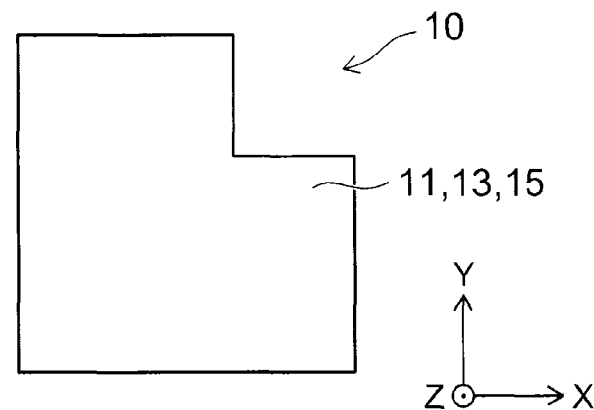
Figure 12D:
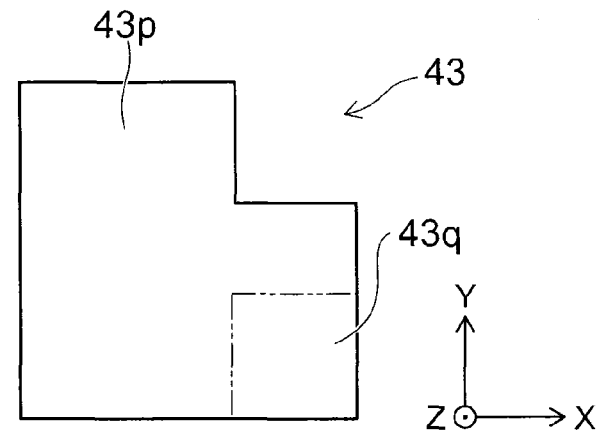

As shown in FIG. 11A and FIG. 12B, a fifth electrode region 69a that is formed by projecting the fifth electrode 69 onto the plane perpendicular to the first direction (in the example, the Z-axis direction) is separated from the reflecting electrode region 51a formed by projecting the reflecting electrode 51 onto the plane perpendicular to the first direction. In other words, the fifth electrode 69 is separated from the reflecting electrode 51 in the direction perpendicular to the first direction.

Thereby, the proportion of the light absorbed by the fifth electrode 69 can be reduced; and the light extraction efficiency can be increased.

As shown in FIG. 13D, at least a portion of a third electrode region 65a that is formed by projecting the third electrode 65 onto the plane perpendicular to the first direction overlaps the second interconnect region 47a formed by projecting the second interconnect electrode 47 onto the plane perpendicular to the first direction. In other words, in the first direction, at least a portion of the third electrode 65 overlaps the second interconnect electrode 47.

An example of a method for manufacturing the semiconductor light emitting device 113 shown in FIG. 10A to FIG. 10D will now be described.

The method for manufacturing the second crystal layer that includes the second stacked body 20 in which the third semiconductor layer 21, the second light emitting layer 25, and the fourth semiconductor layer 23 are provided in this order is similar to that described above in regard to the method for manufacturing the semiconductor light emitting device 111. Thereby, the second semiconductor wafer is made.

The method for forming the reflecting electrode 51, the method for forming the insulating layer 53, and the method for forming the second transmissive electrode portion 41b are similar to those described above in regard to the method for manufacturing the semiconductor light emitting device 111.

The method for manufacturing the first crystal layer that includes the first stacked body 10 in which the first semiconductor layer 11, the first light emitting layer 15, and the second semiconductor layer 13 are provided in this order is similar to that described above in regard to the method for manufacturing the semiconductor light emitting device 111. Thereby, the first semiconductor wafer is made.

The method for forming the first transmissive electrode portion 41a is similar to that described above in regard to the method for manufacturing the semiconductor light emitting device 111. The method for forming a third transmissive electrode portion 43a (referring to FIG. 10B to FIG. 10D) is similar to the method for forming the first transmissive electrode portion 41a. The method for forming the fifth electrode 69 is similar to the method for forming the second electrode 63.

The method for manufacturing a third crystal layer that includes the third stacked body 30 in which the fifth semiconductor layer 31, the third light emitting layer 35, and the sixth semiconductor layer 33 are provided in this order is similar to the method for manufacturing the first crystal layer. Thereby, a third semiconductor wafer is made.

The method for forming a fourth transmissive electrode portion 43b (referring to FIG. 10B to FIG. 10D) is similar to the method for forming the first transmissive electrode portion 41a. The method for forming the fourth electrode 67 is similar to the method for forming the second electrode 63. The method for forming the third electrode 65 is similar to the method for forming the first electrode 61.

A detailed description of the methods that are similar to those described above is omitted as appropriate.

The first transmissive electrode portion 41a on which CMP was performed is directly bonded to the second transmissive electrode portion 41b on which CMP was performed. Plasma cleaning by an oxygen atmosphere is performed in a vacuum. The first semiconductor wafer and the second semiconductor wafer are bonded by applying a pressure of 1 kilonewton (kN) at 100° C. Thereby, the first transmissive electrode portion 41a is electrically connected to the second transmissive electrode portion 41b. The first transmissive electrode portion 41a and the second transmissive electrode portion 41b can be considered to be the same electrode (the first light-transmissive electrode 41). The first interconnect electrode 46 functions as a common interconnect electrode between the second semiconductor layer 13 and the third semiconductor layer 21.

The growth substrate of the first semiconductor wafer is removed. In the case where the growth substrate of the first semiconductor wafer is a sapphire substrate, the growth substrate is removed by LLO.

Dry etching of the exposed first crystal layer is performed. Thereby, the first semiconductor layer 11 is exposed.

A portion (the third transmissive electrode portion 43a) of the second light-transmissive electrode 43 is formed on the exposed first semiconductor layer 11. The thickness of the third transmissive electrode portion 43a is, for example, not less than about 50 nm and not more than about 10000 nm.

The surface (a third electrode surface 43c) of the third transmissive electrode portion 43a is planarized by CMP.

The third transmissive electrode portion 43a on which CMP was performed is directly bonded to the fourth transmissive electrode portion 43b on which CMP was performed. Plasma cleaning by an oxygen atmosphere is performed in a vacuum. The first semiconductor wafer and the third semiconductor wafer are bonded by applying a pressure of 1 kilonewton (kN) at 100° C. Thereby, the third transmissive electrode portion 43a is electrically connected to the fourth transmissive electrode portion 43b. The third transmissive electrode portion 43a and the fourth transmissive electrode portion 43b can be considered to be the same electrode (the second light-transmissive electrode 43). The second interconnect electrode 47 functions as a common interconnect electrode between the first semiconductor layer 11 and the sixth semiconductor layer 33.

The growth substrate of the third semiconductor wafer is removed. In the case where the growth substrate of the third semiconductor wafer is a sapphire substrate, the growth substrate is removed by LLO.

Dry etching of the exposed third crystal layer is performed. Thereby, the fifth semiconductor layer 31 is exposed.

Al/Ni/Au is formed on the exposed fifth semiconductor layer 31 by lift-off. Thereby, the third electrode 65 is formed.

According to the embodiment, any number of light emitting layers can be stacked by repeating the same processes.

For example, a white LED can be realized by setting the light emission wavelengths of the light emitting layers (in the example, the first light emitting layer 15, the second light emitting layer 25, and the third light emitting layer 35) to be red, green, and blue. Conversely, when a fluorescer is used, a Stokes shift loss occurs due to the wavelength conversion. Therefore, there is room for improvement to increase the efficiency. In the case where all of the colors are created by LEDs, the wavelength conversion is unnecessary. Therefore, the efficiency can be increased.

Second Embodiment

Figure 14A:
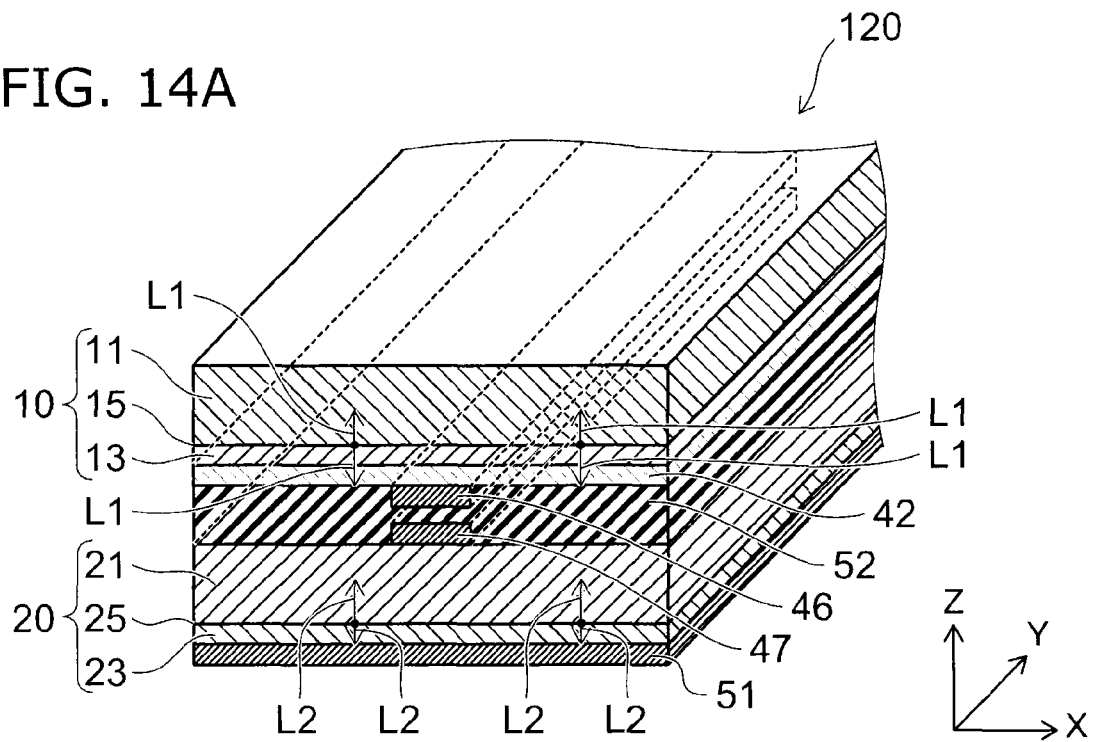
FIG. 14A and FIG. 14B are schematic perspective views showing the general concept of a semiconductor light emitting device according to a second embodiment.
Figure 14B:
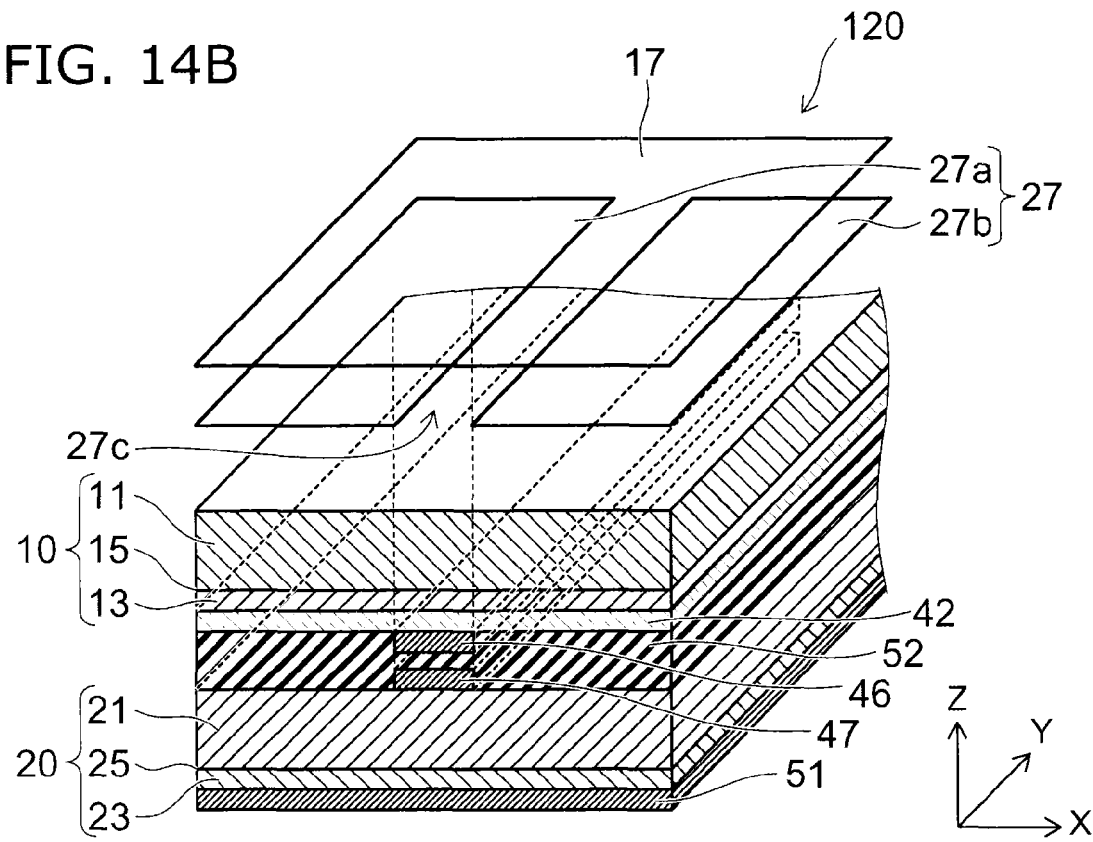

FIG. 14A and FIG. 14B are schematic perspective views showing the general concept of a semiconductor light emitting device according to a second embodiment.

FIG. 14A is a schematic perspective view showing the general concept of the structure of the semiconductor light emitting device according to the second embodiment. FIG. 14B is a schematic perspective view showing the extraction region of the light emitted from the first light emitting layer and the extraction region of the light emitted from the second light emitting layer.

The semiconductor light emitting device 120 shown in FIG. 14A and FIG. 14B includes the first stacked body 10, the second stacked body 20, the light-transmissive electrode 42, the first interconnect electrode 46, the second interconnect electrode 47, the reflecting electrode 51, and a bonding layer 52.

The first stacked body 10 includes the first semiconductor layer 11, the second semiconductor layer 13, and the first light emitting layer 15.

The second stacked body 20 includes the third semiconductor layer 21, the fourth semiconductor layer 23, and the second light emitting layer 25.

The first semiconductor layer 11, the second semiconductor layer 13, the first light emitting layer 15, the third semiconductor layer 21, the fourth semiconductor layer 23, and the second light emitting layer 25 are similar to those described above in regard to FIG. 1A and FIG. 1B. A detailed description of these components is omitted as appropriate.

The bonding layer 52 is provided between the second semiconductor layer 13 and the third semiconductor layer 21. The bonding layer 52 transmits the first light L1 emitted by the first light emitting layer 15. The bonding layer 52 transmits the second light L2 emitted by the second light emitting layer 25.

The first interconnect electrode 46 is provided between the second semiconductor layer 13 and the third semiconductor layer 21.

The light-transmissive electrode 42 is provided between the second semiconductor layer 13 and the bonding layer 52. The light-transmissive electrode 42 has an ohmic contact with the second semiconductor layer 13. The light-transmissive electrode 42 is electrically connected to the first interconnect electrode 46. The light-transmissive electrode 42 transmits the first light L1 emitted by the first light emitting layer 15. The light-transmissive electrode 42 transmits the second light L2 emitted by the second light emitting layer 25.

The light-transmissive electrode 42 has a transmittance of 50% or more for the light emitted from the first light emitting layer 15. The light-transmissive electrode 42 has a transmittance of 50% or more for the light emitted from the second light emitting layer 25. The light-transmissive electrode 42 is conductive. The light-transmissive electrode 42 includes a material that can have an ohmic contact with at least one selected from a p-type semiconductor layer and an n-type semiconductor layer. For example, the material of the light-transmissive electrode 42 may be ITO, ITON, ZnO, etc. The thickness (the length in the Z-axis direction) of the light-transmissive electrode 42 is, for example, not less than about 10 nm and not more than about 10000 nm. The transmittance of the light is higher when the thickness of the light-transmissive electrode 42 is relatively thin. In the case where the thickness of the light-transmissive electrode 42 is relatively thick, the sheet resistance of the light-transmissive electrode 42 is lower. Thereby, the spreading properties of the current flowing through the light-transmissive electrode 42 improve. The light-transmissive electrode 42 may include a relatively thin metal, an oxide of a relatively thin metal, or graphene.

The second interconnect electrode 47 is provided between the second semiconductor layer 13 and the third semiconductor layer 21. The second interconnect electrode 47 has an ohmic contact with the third semiconductor layer 21.

The first light emitting layer 15 is positioned inside the reflecting electrode 51 when projected onto the plane perpendicular to the first direction. This is elaborated below. The reflecting electrode 51 has an ohmic contact with the fourth semiconductor layer 23. The reflecting electrode 51 includes, for example, silver (Ag).

Similarly to the semiconductor light emitting device 110 described above in regard to FIG. 1A and FIG. 1B, in the semiconductor light emitting device 120 shown in FIG. 14A and FIG. 14B, the light emitted from the first light emitting layer 15 is extracted mainly in the Z-axis direction. The light emitted from the second light emitting layer 25 is extracted mainly in the Z-axis direction.

A shadow does not occur for the first light L1 that is emitted from the first light emitting layer 15 and extracted in the Z-axis direction. A non-light emitting region of the first light emitting layer 15 does not occur. Therefore, for example, as shown in FIG. 14B, the first light extraction region 17 exists for the first light L1.

The shadow 27c due to the first interconnect electrode 46 and the second interconnect electrode 47 occurs for the second light L2 that is emitted from the second light emitting layer 25 and extracted in the Z-axis direction. Therefore, for example, as shown in FIG. 14B, the second light extraction region 27 has the third extraction portion 27a and the fourth extraction portion 27b. The third extraction portion 27a is separated from the fourth extraction portion 27b in the plane (the XY plane) perpendicular to the Z-axis direction.

In the embodiment, in the first direction, the first interconnect electrode 46 overlaps the second interconnect electrode 47. Thereby, the occurrence of the shadow 27c due to the first interconnect electrode 46 for the second light L2 emitted from the second light emitting layer 25 can be suppressed. The surface area of the second light extraction region 27 can be increased further. Therefore, the luminous efficiency of the semiconductor light emitting device 120 can be increased. The surface area of the portion where the second light extraction region 27 overlaps the first light extraction region 17 can be increased further. Therefore, color breakup can be suppressed.

FIG. 15A to FIG. 15D are schematic views showing a semiconductor light emitting device according to the second embodiment.

Figure 16A:
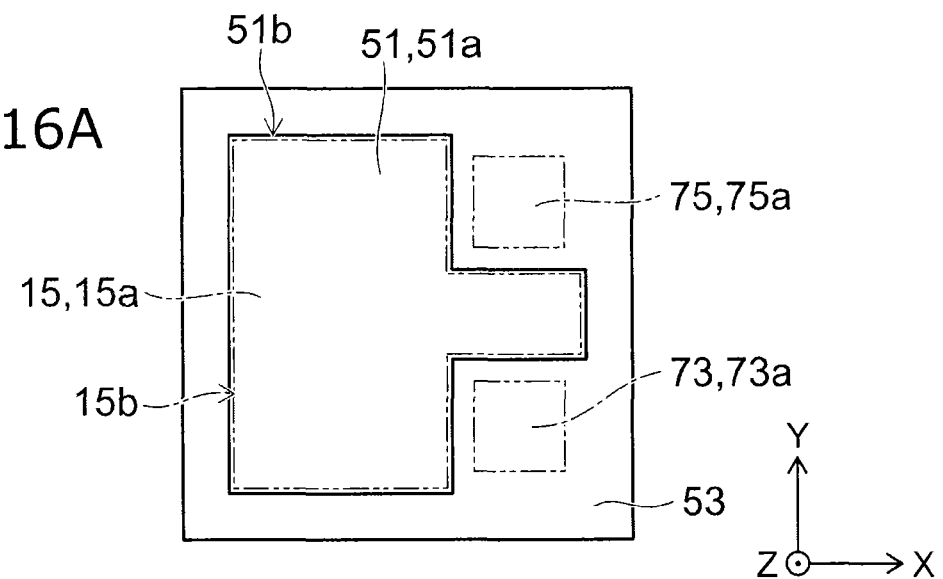
FIG. 16A to FIG. 16C are schematic plan views showing components of the semiconductor light emitting device according to the second embodiment.
Figure 16B:
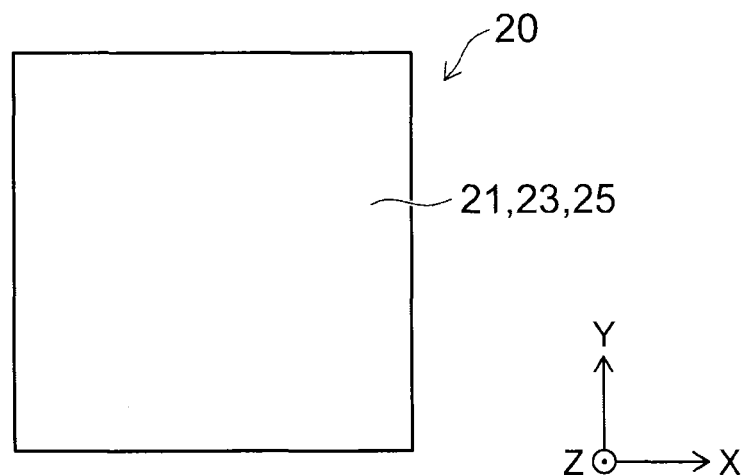
Figure 16C:
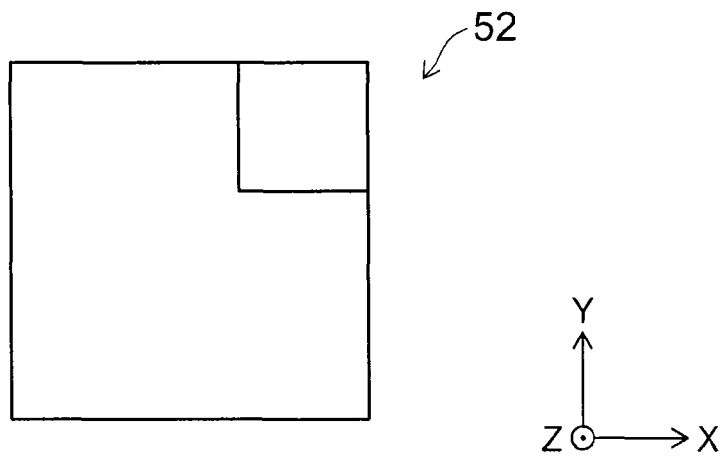

FIG. 16A to FIG. 16C are schematic plan views showing components of the semiconductor light emitting device according to the second embodiment.

FIG. 17A to FIG. 17D are schematic plan views showing other components of the semiconductor light emitting device according to the second embodiment.

Figure 18A:
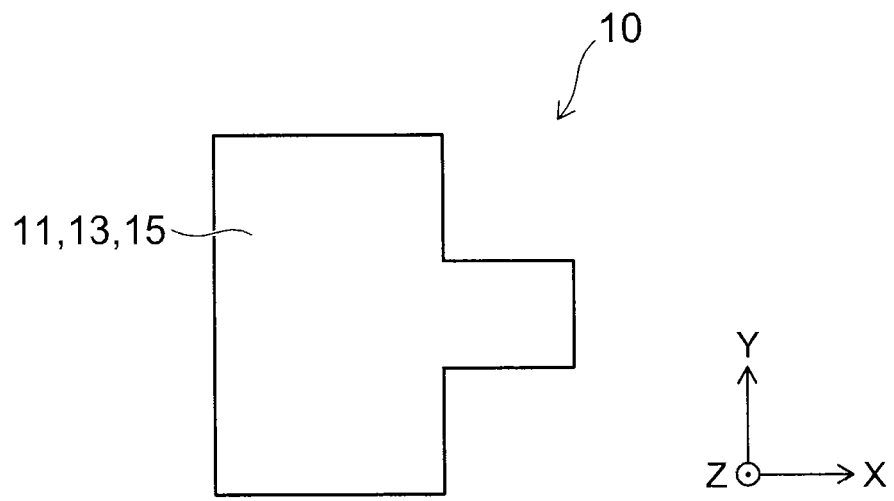
FIG. 18A to FIG. 18C are schematic plan views showing other components of the semiconductor light emitting device according to the second embodiment.
Figure 18B:
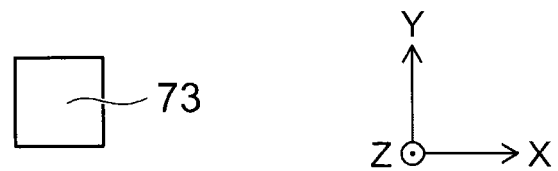
Figure 18C:
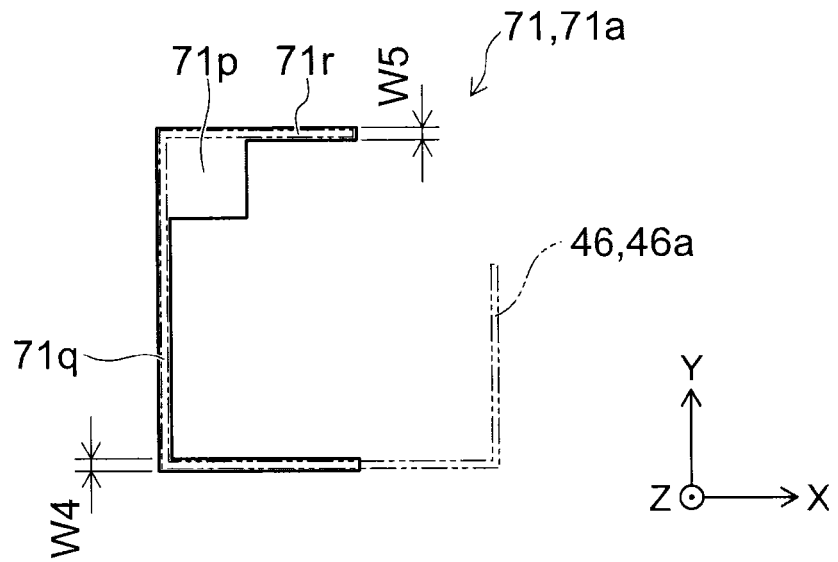

FIG. 18A to FIG. 18C are schematic plan views showing other components of the semiconductor light emitting device according to the second embodiment.

Figure 15A:
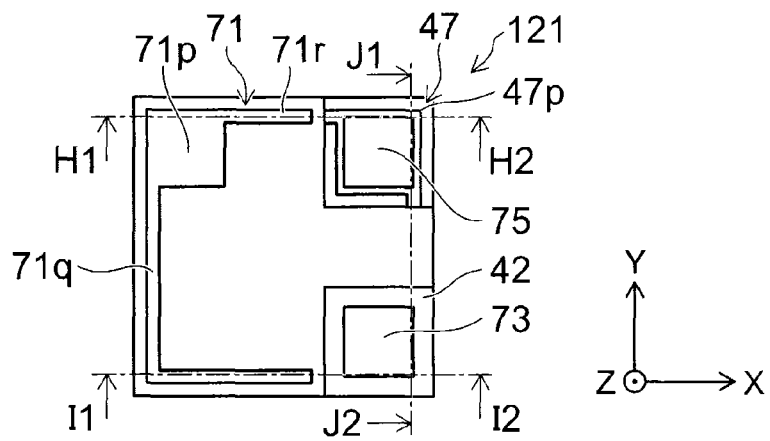
FIG. 15A to FIG. 15D are schematic views showing a semiconductor light emitting device according to the second embodiment.
Figure 15B:
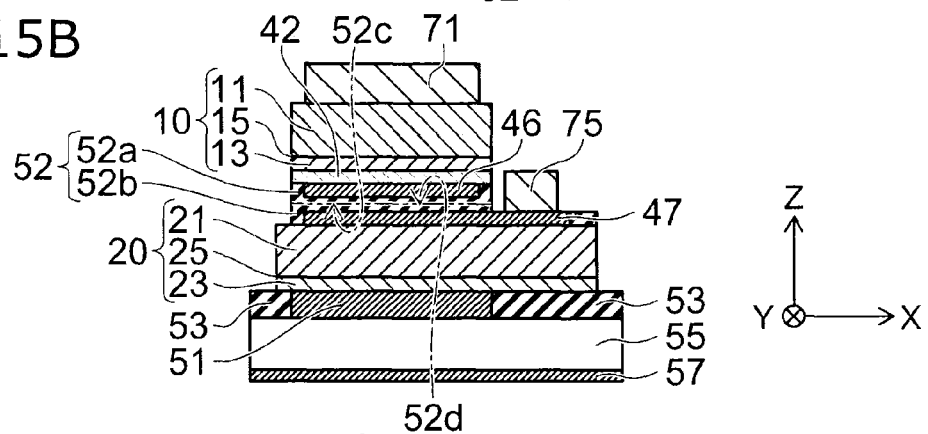
Figure 15C:
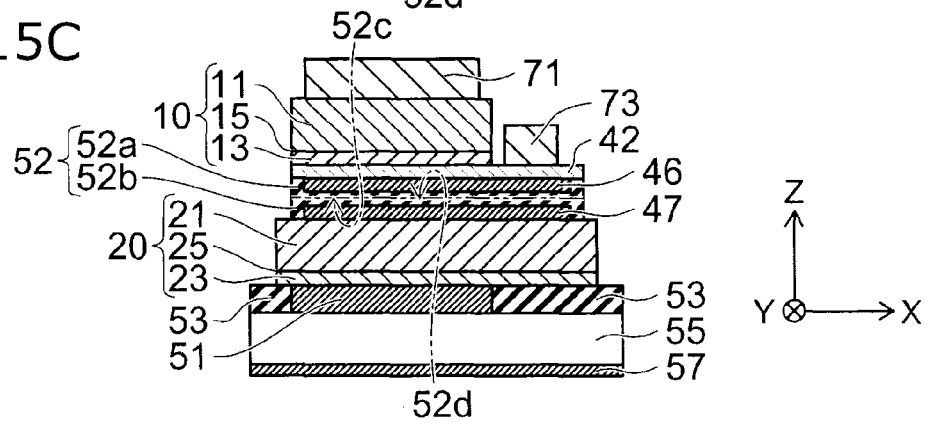
Figure 15D:
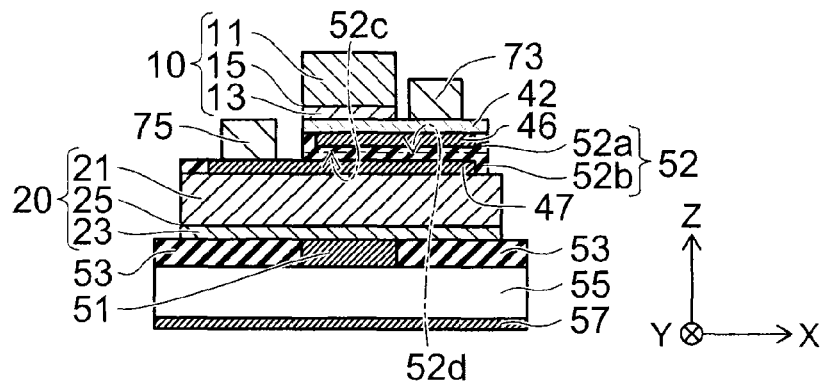

FIG. 15A is a schematic plan view showing the semiconductor light emitting device according to the second embodiment. FIG. 15B is a cross-sectional view along line H1-H2 shown in FIG. 15A. FIG. 15C is a cross-sectional view along line I1-I2 shown in FIG. 15A. FIG. 15D is a cross-sectional view along line J1-J2 shown in FIG. 15A.

The semiconductor light emitting device 121 shown in FIG. 15A to FIG. 15D includes the first stacked body 10, the second stacked body 20, the light-transmissive electrode 42, the first interconnect electrode 46, the second interconnect electrode 47, the bonding layer 52, the reflecting electrode 51, the insulating layer 53, the support substrate 55, the back surface electrode 57, a first electrode 71, a second electrode 73, and a third electrode 75.

The first stacked body 10 includes the first semiconductor layer 11, the second semiconductor layer 13, and the first light emitting layer 15.

The second stacked body 20 includes the third semiconductor layer 21, the fourth semiconductor layer 23, and the second light emitting layer 25.

The first semiconductor layer 11, the second semiconductor layer 13, the first light emitting layer 15, the third semiconductor layer 21, the fourth semiconductor layer 23, the second light emitting layer 25, the reflecting electrode 51, the insulating layer 53, the support substrate 55, and the back surface electrode 57 are similar to those described above in regard to FIG. 1A and FIG. 1B. A detailed description of these components is omitted as appropriate.

Figure 17A:
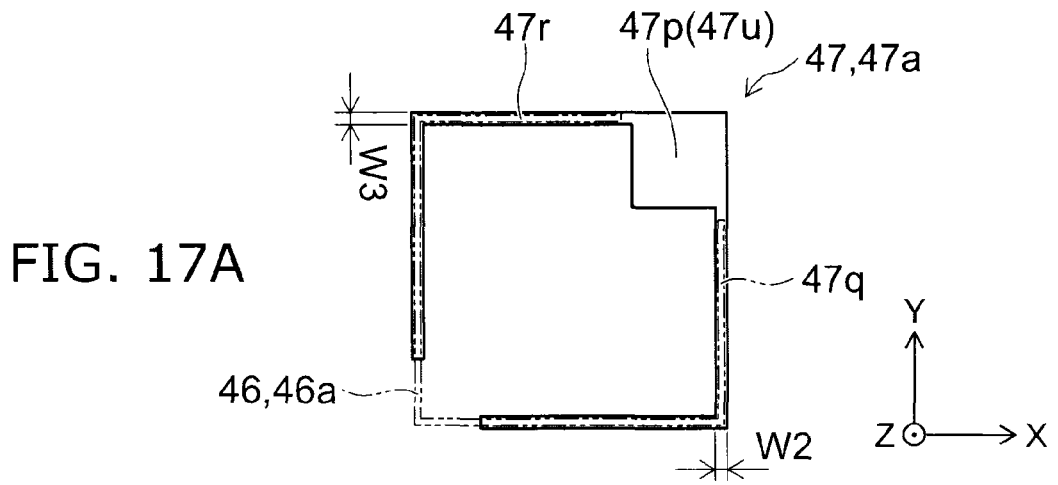
FIG. 17A to FIG. 17D are schematic plan views showing other components of the semiconductor light emitting device according to the second embodiment.
Figure 17B:
Figure 17C:
Figure 17D:
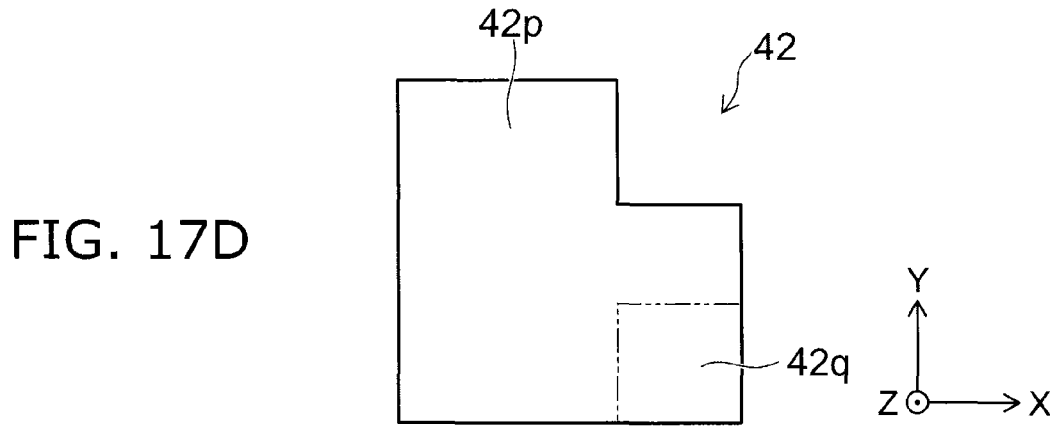

As shown in FIG. 17D, the light-transmissive electrode 42 has a first transmissive portion 42p and a second transmissive portion 42q. The first transmissive portion 42p is provided between the second semiconductor layer 13 and the bonding layer 52. The second transmissive portion 42q is arranged with the first transmissive portion 42p in the plane perpendicular to the first direction. In other words, the second transmissive portion 42q is arranged with the first transmissive portion 42p in a direction perpendicular to the first direction.

The first semiconductor layer 11 is disposed between the first electrode 71 and the first light emitting layer 15. The first electrode 71 is electrically connected to the first semiconductor layer 11. As shown in FIG. 15A and FIG. 18C, the first electrode 71 has a pad portion 71p, a first fine wire portion 71q, and a second fine wire portion 71r. The first fine wire portion 71q extends outward from the pad portion 71p with the pad portion 71p as a base portion. The second fine wire portion 71r extends outward from the pad portion 71p with the pad portion 71p as a base portion.

As shown in FIG. 15C and FIG. 15D, the second transmissive portion 42q is disposed between the second electrode 73 and the bonding layer 52. The second electrode 73 is electrically connected to the second semiconductor layer 13.

As shown in FIG. 17A, the second interconnect electrode 47 has a first interconnect portion 47p, a first fine wire portion 47q, and a second fine wire portion 47r. The first fine wire portion 47q extends outward from the first interconnect portion 47p with the first interconnect portion 47p as a base portion. The second fine wire portion 47r extends outward from the first interconnect portion 47p with the first interconnect portion 47p as a base portion.

As shown in FIG. 15A, FIG. 15B, and FIG. 15D, the first interconnect portion 47p is disposed between the third electrode 75 and the third semiconductor layer 21. The third electrode 75 is electrically connected to the third semiconductor layer 21.

As shown in FIG. 16A and FIG. 18A, the outer edge (the first light emitting layer outer edge 15b) of the first light emitting layer region 15a that is formed by projecting the first light emitting layer 15 onto the plane perpendicular to the first direction (in the example, the Z-axis direction) is positioned inside the outer edge (the reflecting electrode outer edge 51b) of the reflecting electrode region 51a formed by projecting the reflecting electrode 51 onto the plane perpendicular to the first direction. In other words, in the first direction, the first light emitting layer 15 is positioned inside the reflecting electrode 51. In the first direction, the first light emitting layer 15 may be aligned with the reflecting electrode 51.

Thereby, uneven color can be reduced while increasing the light extraction efficiency.

As shown in FIG. 17A, at least a portion of the first interconnect region 46a that is formed by projecting the first interconnect electrode 46 onto the plane perpendicular to the first direction (in the example, the Z-axis direction) overlaps the second interconnect region 47a formed by projecting the second interconnect electrode 47 onto the plane perpendicular to the first direction. In other words, in the first direction, at least a portion of the first interconnect electrode 46 overlaps the second interconnect electrode 47. Thereby, uneven color can be reduced while increasing the light extraction efficiency.

As shown in FIG. 16A and FIG. 18B, a second electrode region 73a that is formed by projecting the second electrode 73 onto the plane perpendicular to the first direction (in the example, the Z-axis direction) is separated from the reflecting electrode region 51a formed by projecting the reflecting electrode 51 onto the plane perpendicular to the first direction. In other words, the second electrode 73 is separated from the reflecting electrode 51 in a direction perpendicular to the first direction.

In the first direction, the light that is emitted at the position overlapping the second electrode 73 is absorbed relatively easily by the second electrode 73. In the case where the second electrode 73 is separated from the reflecting electrode 51 in the direction perpendicular to the first direction, the proportion of the light absorbed by the second electrode 73 can be reduced; and the light extraction efficiency can be increased.

As shown in FIG. 16A and FIG. 17C, a third electrode region 75a that is formed by projecting the third electrode 75 onto the plane perpendicular to the first direction (in the example, the Z-axis direction) is separated from the reflecting electrode region 51a formed by projecting the reflecting electrode 51 onto the plane perpendicular to the first direction. In other words, the third electrode 75 is separated from the reflecting electrode 51 in a direction perpendicular to the first direction.

In the first direction, the light emitted at the position overlapping the third electrode 75 is absorbed relatively easily by the third electrode 75. In the case where the third electrode 75 is separated from the reflecting electrode 51 in a direction perpendicular to the first direction, the proportion of the light absorbed by the third electrode 75 can be reduced; and the light extraction efficiency can be increased.

As shown in FIG. 18C, at least a portion of a first electrode region 71a that is formed by projecting the first electrode 71 onto the plane perpendicular to the first direction overlaps the first interconnect region 46a formed by projecting the first interconnect electrode 46 onto the plane perpendicular to the first direction. In other words, in the first direction, at least a portion of the first electrode 71 overlaps the first interconnect electrode 46. Thereby, uneven color can be reduced while increasing the light extraction efficiency.

An example of a method for manufacturing the semiconductor light emitting device 121 shown in FIG. 15A to FIG. 15D will now be described.

From the process of growing the second crystal layer to the process of exposing the third semiconductor layer 21, the manufacturing method is similar to that described above in regard to the example of the method for manufacturing the semiconductor light emitting device 111 shown in FIG. 2A to FIG. 2C. A detailed description of these components is omitted as appropriate.

Al/Ni/Au is formed with a thickness of 500 nm on the exposed third semiconductor layer 21 by lift-off. Thereby, the second interconnect electrode 47 is formed. The second interconnect electrode 47 has the first interconnect portion 47p, the first fine wire portion 47q, and the second fine wire portion 47r. The width (the first fine wire portion width W2) of the first fine wire portion 47q (referring to FIG. 17A) is, for example, about 10 μm. The width (the second fine wire portion width W3) of the second fine wire portion 47r (referring to FIG. 17A) is, for example, about 10 μm.

$SiO_2$ is formed on the third semiconductor layer 21. Thereby, a portion (a second bonding portion 52b) of the bonding layer 52 is formed. The second bonding portion 52b covers the second interconnect electrode 47. The thickness (the length in the Z-axis direction) of the second bonding portion 52b is, for example, not less than about 500 nm and not more than about 10000 nm. The surface (a second bonding surface 52d) of the second bonding portion 52b is planarized by CMP.

From the process of growing the first crystal layer to the process of forming the light-transmissive electrode 42 (in the semiconductor light emitting device 111, the first light-transmissive electrode 41), the manufacturing method is similar to that described above in regard to the example of the method for manufacturing the semiconductor light emitting device 111 shown in FIG. 2A to FIG. 2C. A detailed description of these components is omitted as appropriate.

Ti/Pt/Au is formed with a thickness of 500 nm on the light-transmissive electrode 42 by lift-off. Thereby, the first interconnect electrode 46 is formed. The resistivity of the light-transmissive electrode 42 is relatively high. The first interconnect electrode 46 is formed to improve the current spreading properties. The degree of the current spreading is a result of the resistivity of the light-transmissive electrode 42. By forming the first interconnect electrode 46, the current can be spread to a relatively wide region of the second semiconductor layer 13. The width (the first interconnect electrode width W1) of the first interconnect electrode 46 (referring to FIG. 17B) is, for example, about 10 μm.

$SiO_2$ is formed on substantially the entire light-transmissive electrode 42. Thereby, another portion (a first bonding portion 52a) of the bonding layer 52 is formed. The first bonding portion 52a covers the first interconnect electrode 46. The thickness (the length in the Z-axis direction) of the first bonding portion 52a is, for example, not less than about 500 nm and not more than about 10000 nm. The surface (a first bonding surface 52c) of the first bonding portion 52a is planarized by CMP.

The first bonding portion 52a on which CMP was performed is directly bonded to the second bonding portion 52b on which CMP was performed. Plasma cleaning by an oxygen atmosphere is performed in a vacuum. The first semiconductor wafer and the second semiconductor wafer are bonded by applying a pressure of 1 kN at 100° C.

The growth substrate of the first semiconductor wafer is removed. In the case where the growth substrate of the first semiconductor wafer is a sapphire substrate, the growth substrate is removed by LLO.

Dry etching of the exposed first crystal layer is performed. Thereby, the first semiconductor layer 11 is exposed.

A portion of the first crystal layer is removed by dry etching. Thereby, the light-transmissive electrode 42 is exposed.

A portion of the exposed light-transmissive electrode 42 is removed by dry etching. Thereby, the second crystal layer (in the example, the third semiconductor layer 21) and the first interconnect portion 47p of the second interconnect electrode 47 are exposed.

A portion of the exposed second crystal layer is removed by dry etching. Thereby, the insulating layer 53 is exposed.

Ti/Pt/Au is formed with a thickness of 500 nm on the exposed light-transmissive electrode 42 by lift-off. Thereby, the second electrode 73 is formed. Ti/Pt/Au is formed with a thickness of 500 nm on the exposed first interconnect portion 47p by lift-off. Thereby, the third electrode 75 is formed.

Al/Ni/Au is formed with a thickness of 500 nm on the exposed first semiconductor layer 11 by lift-off. The first electrode 71 has the pad portion 71p, the first fine wire portion 71q, and the second fine wire portion 71r. The first fine wire portion 71q and the second fine wire portion 71r function to spread the current. The width (a first fine wire portion width W4) of the first fine wire portion 71q (referring to FIG. 18C) is, for example, about 10 μm. The width (a second fine wire portion width W5) of the second fine wire portion 71r (referring to FIG. 18C) is, for example, about 10 μm.

At least a portion of the first interconnect electrode 46 overlaps the second interconnect electrode 47 in the first direction (in the example, the Z-axis direction). A portion of the second light emitted from the second light emitting layer 25 is blocked by the first interconnect electrode 46 and is not extracted easily directly above the first interconnect electrode 46. Conversely, according to the embodiment, the second light emitted from the second light emitting layer 25 is not easily blocked by the second interconnect electrode 47 because, in the first direction, at least a portion of the first interconnect electrode 46 overlaps the second interconnect electrode 47. Therefore, the light extraction efficiency increases. Uneven color can be reduced.

A dichromic mirror may be provided between the first crystal layer and the second crystal layer. In such a case, the dichromic mirror transmits the second light L2 emitted from the second light emitting layer 25 and reflects the first light L1 emitted from the first light emitting layer 15. An effect that is similar to that of the dichromic mirror may be realized by adjusting the thickness (the length in the Z-axis direction) of the light-transmissive electrode 42, the thickness (the length in the Z-axis direction) of the first bonding portion 52a, and the thickness (the length in the Z-axis direction) of the second bonding portion 52b. The dichromic mirror may be provided in the interior of the first bonding portion 52a or the interior of the second bonding portion 52b.

The material of the bonding layer 52 is not limited to $SiO_2$ and may be another dielectric. It is sufficient for the bonding layer 52 to include a material that is insulative, can ensure the bonding strength, and is transmissive to the first light L1 emitted from the first light emitting layer 15 and the second light L2 emitted from the second light emitting layer 25. In the case where the material of the bonding layer 52 is $SiO_2$ and the thickness (the length in the Z-axis direction) of the $SiO_2$ is relatively thin, the heat dissipation from the first stacked body 10 is relatively good.

Figure 19A:
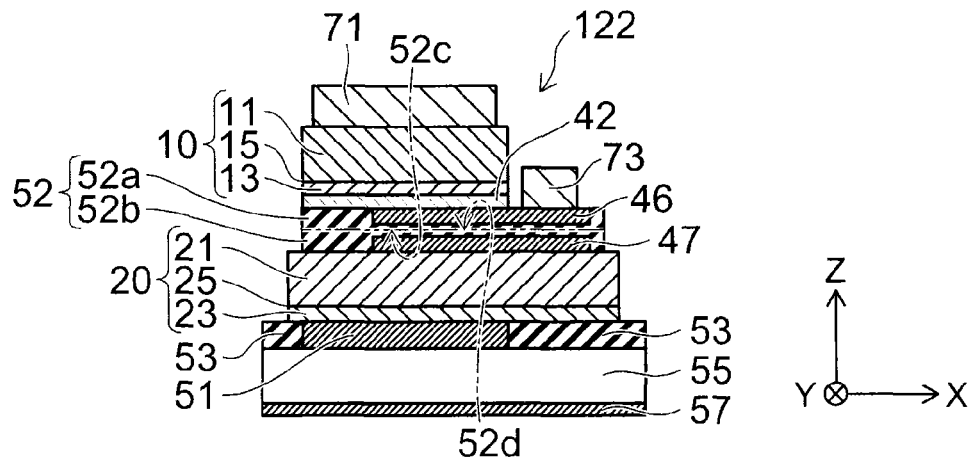
FIG. 19A to FIG. 19C are schematic views showing another semiconductor light emitting device according to the second embodiment.
Figure 19B:
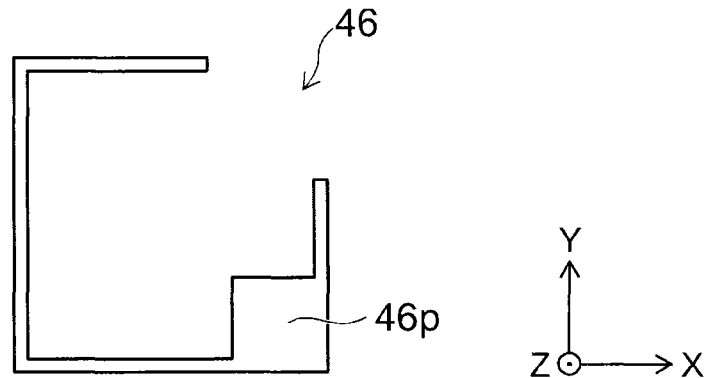
Figure 19C:
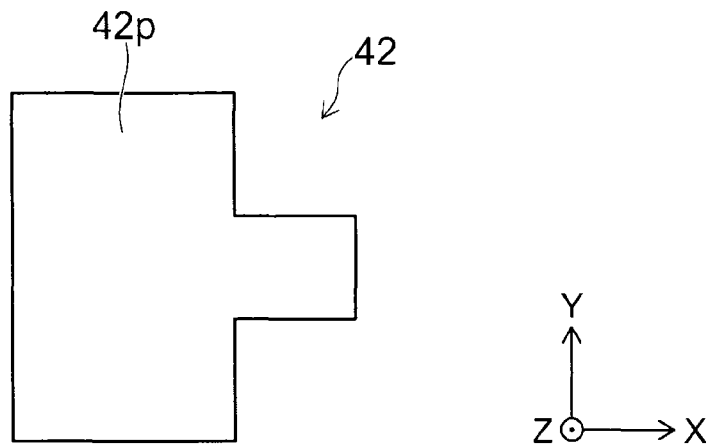

FIG. 19A to FIG. 19C are schematic views showing another semiconductor light emitting device according to the second embodiment.

FIG. 19A corresponds to the cross-sectional view along line I1-I2 of FIG. 15A.

As shown in FIG. 19B, the first interconnect electrode 46 has a second interconnect portion 46p. The semiconductor light emitting device 122 shown in FIG. 19A includes the semiconductor light emitting device 121 shown in FIG. 15A to FIG. 15D in which the second interconnect portion 46p of the first interconnect electrode 46 is disposed between the second electrode 73 and the bonding layer 52. In other words, the second transmissive portion 42q (referring to FIG. 17D) is not disposed between the second electrode 73 and the bonding layer 52. As shown in FIG. 19C, the light-transmissive electrode 42 does not have the second transmissive portion 42q.

The second interconnect electrode 47 is similar to that described above in regard to FIG. 17A. As shown in FIG. 17A, the second interconnect electrode 47 has a third interconnect portion 47u. The first interconnect portion 47p of the semiconductor light emitting device 121 described above in regard to FIG. 15A to FIG. 15D corresponds to the third interconnect portion 47u of the semiconductor light emitting device 122 shown in FIG. 19A.

According to the embodiment, the light-transmissive electrode 42 can be used as an etching stop layer in the dry etching of the first crystal layer. According to the embodiment, the first bonding portion 52a can be directly bonded to the second bonding portion 52b without patterning the light-transmissive electrode 42. The contact resistance between the second electrode 73 and the second interconnect portion 46p is relatively low. The adhesion between the second electrode 73 and the second interconnect portion 46p is relatively high.

Third Embodiment

Figure 20A:
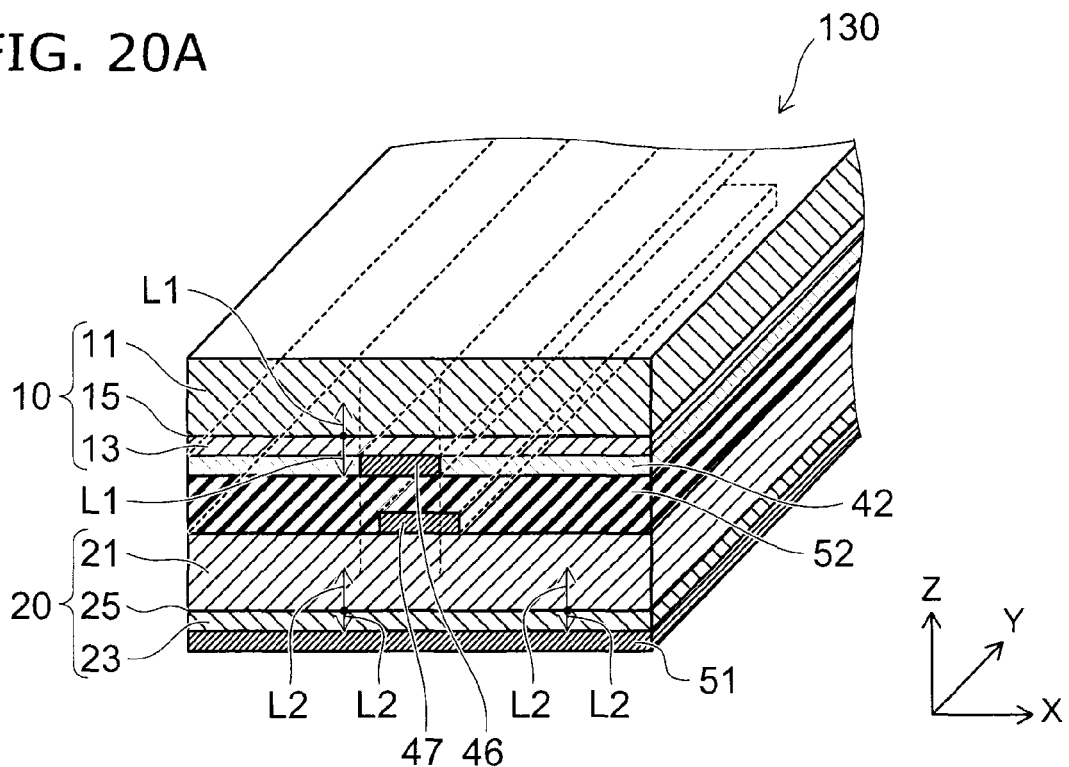
FIG. 20A and FIG. 20B are schematic perspective views showing the general concept of a semiconductor light emitting device according to a third embodiment.
Figure 20B:
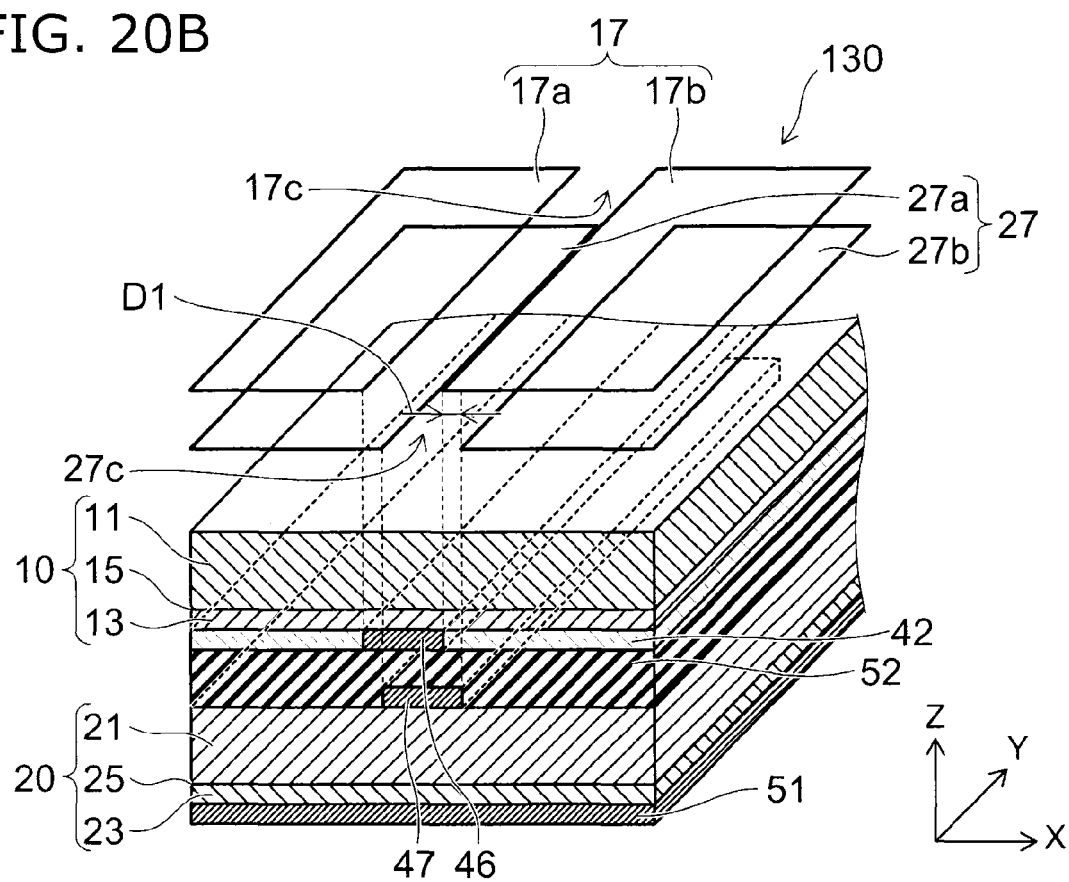

FIG. 20A and FIG. 20B are schematic perspective views showing the general concept of a semiconductor light emitting device according to a third embodiment.

FIG. 20A is a schematic perspective view showing the general concept of the structure of the semiconductor light emitting device according to the third embodiment. FIG. 20B is a schematic perspective view showing the extraction region of the light emitted from the first light emitting layer and the extraction region of the light emitted from the second light emitting layer.

The semiconductor light emitting device 130 shown in FIG. 20A and FIG. 20B includes the first stacked body 10, the second stacked body 20, the light-transmissive electrode 42, the first interconnect electrode 46, the second interconnect electrode 47, the reflecting electrode 51, and the bonding layer 52.

The first stacked body 10 includes the first semiconductor layer 11, the second semiconductor layer 13, and the first light emitting layer 15.

The second stacked body 20 includes the third semiconductor layer 21, the fourth semiconductor layer 23, and the second light emitting layer 25.

The first semiconductor layer 11, the second semiconductor layer 13, the first light emitting layer 15, the third semiconductor layer 21, the fourth semiconductor layer 23, and the second light emitting layer 25 are similar to those described above in regard to FIG. 1A and FIG. 1B. A detailed description of these components is omitted as appropriate.

The first interconnect electrode 46 is provided between the second semiconductor layer 13 and the third semiconductor layer 21. The first interconnect electrode 46 is electrically connected to the light-transmissive electrode 42. The first interconnect electrode 46 has a non-ohmic contact with the second semiconductor layer 13. Otherwise, the structure is similar to the structure of the semiconductor light emitting device 120 described above in regard to FIG. 14A and FIG. 14B.

The non-light emitting region 17c of the first light emitting layer 15 occurs for the first light L1 that is emitted from the first light emitting layer 15 and extracted in the Z-axis direction. Therefore, for example, as shown in FIG. 20B, the first light extraction region 17 has the first extraction portion 17a and the second extraction portion 17b. The first extraction portion 17a is separated from the second extraction portion 17b in the plane (the XY plane) perpendicular to the Z-axis direction.

The shadow 27c that is due to the first interconnect electrode 46 occurs for the second light L2 that is emitted from the second light emitting layer 25 and extracted in the Z-axis direction. Therefore, for example, as shown in FIG. 20B, the second light extraction region 27 has the third extraction portion 27a and the fourth extraction portion 27b. The third extraction portion 27a is separated from the fourth extraction portion 27b in the plane (the XY plane) perpendicular to the Z-axis direction.

According to the embodiment, because the non-light emitting region 17c occurs, the first light extraction region 17 and the second light extraction region 27 can be aligned. Thereby, color breakup can be suppressed further while increasing the light extraction efficiency. In the case where a shift D1 between the first interconnect electrode 46 and the second interconnect electrode 47 when projected onto the plane perpendicular to the first direction (in the example, the Z-axis direction) is relatively small, color breakup is relatively suppressed.

FIG. 21A to FIG. 21D are schematic views showing a semiconductor light emitting device according to the third embodiment.

Figure 22A:
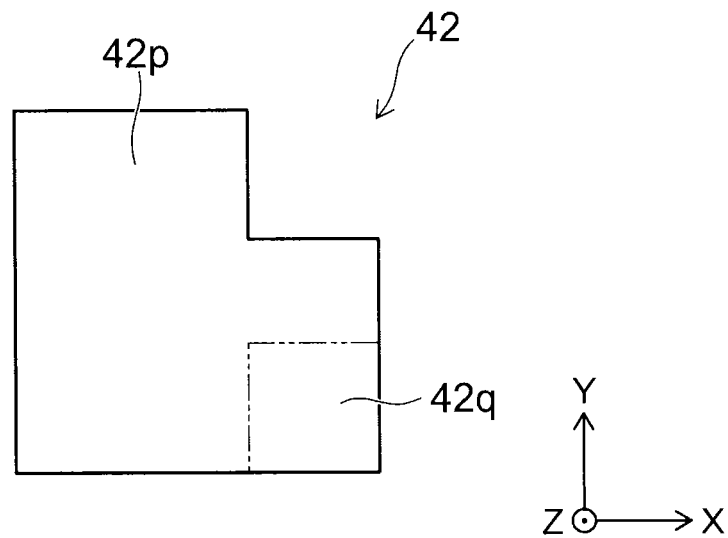
FIG. 22A and FIG. 22B are schematic plan views showing components of the semiconductor light emitting device according to the third embodiment.
Figure 22B:
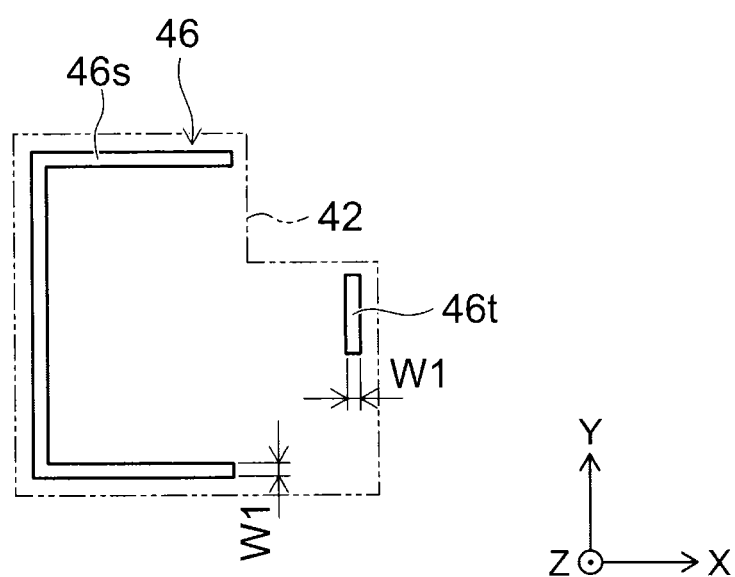

FIG. 22A and FIG. 22B are schematic plan views showing components of the semiconductor light emitting device according to the third embodiment.

Figure 21A:
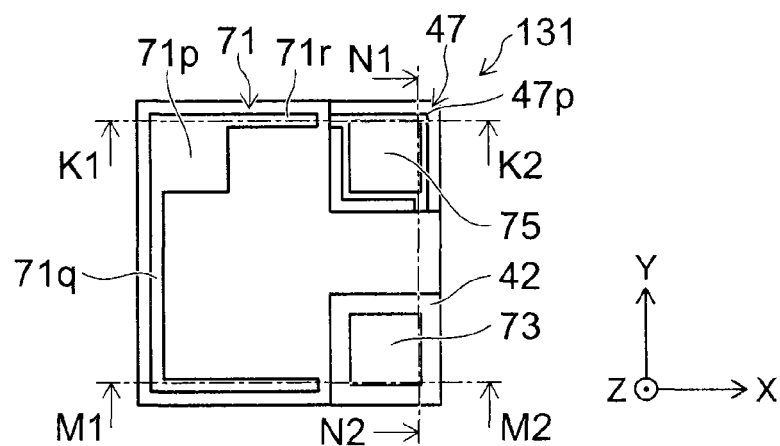
FIG. 21A to FIG. 21D are schematic views showing a semiconductor light emitting device according to the third embodiment.
Figure 21B:
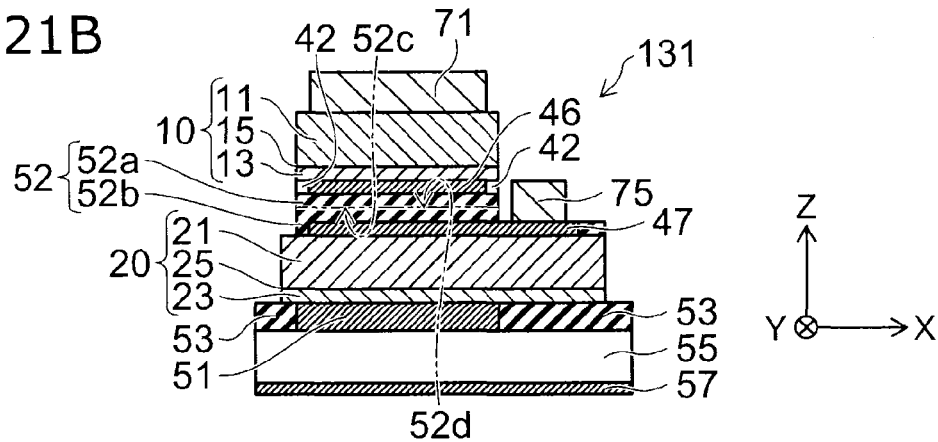
Figure 21C:
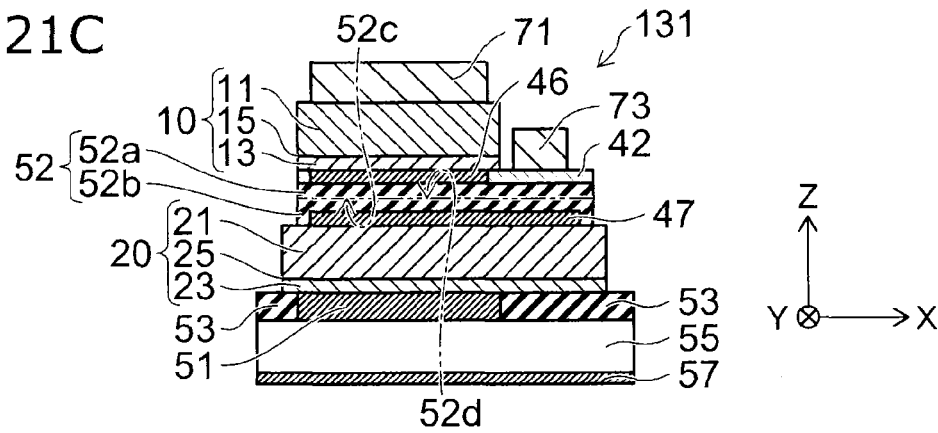
Figure 21D:
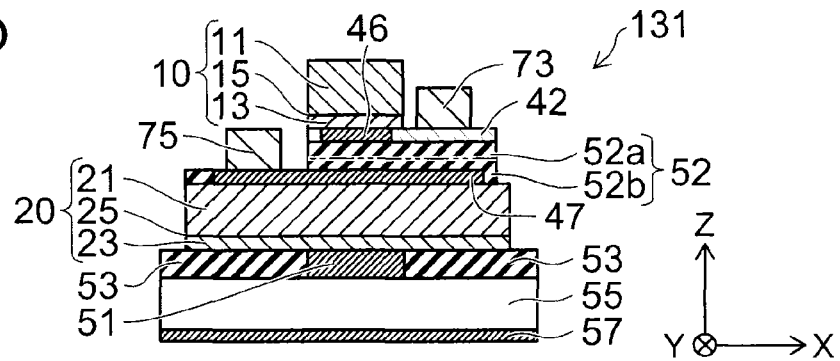

FIG. 21A is a schematic plan view showing the semiconductor light emitting device according to the third embodiment. FIG. 21B is a cross-sectional view along line K1-K2 of FIG. 21A. FIG. 21C is a cross-sectional view along line M1-M2 of FIG. 21A. FIG. 21D is a cross-sectional view along line N1-N2 of FIG. 21A.

The semiconductor light emitting device 131 shown in FIG. 21A to FIG. 21D includes the first stacked body 10, the second stacked body 20, the light-transmissive electrode 42, the first interconnect electrode 46, the second interconnect electrode 47, the bonding layer 52, the reflecting electrode 51, the insulating layer 53, the support substrate 55, the back surface electrode 57, the first electrode 71, the second electrode 73, and the third electrode 75.

The first stacked body 10 includes the first semiconductor layer 11, the second semiconductor layer 13, and the first light emitting layer 15.

The second stacked body 20 includes the third semiconductor layer 21, the fourth semiconductor layer 23, and the second light emitting layer 25.

The first semiconductor layer 11, the second semiconductor layer 13, the first light emitting layer 15, the third semiconductor layer 21, the fourth semiconductor layer 23, the second light emitting layer 25, the reflecting electrode 51, the insulating layer 53, the support substrate 55, and the back surface electrode 57 are similar to those described above in regard to FIG. 1A and FIG. 1B. A detailed description of these components is omitted as appropriate.

As shown in FIG. 22A, the light-transmissive electrode 42 has the first transmissive portion 42p and the second transmissive portion 42q. The second transmissive portion 42q is arranged with the first transmissive portion 42p in the plane perpendicular to the first direction. In other words, the second transmissive portion 42q is arranged with the first transmissive portion 42p in a direction perpendicular to the first direction. As shown in FIG. 21C and FIG. 21D, the second transmissive portion 42q is disposed between the second electrode 73 and the bonding layer 52. The second electrode 73 is electrically connected to the second semiconductor layer 13.

As shown in FIG. 22B, the first interconnect electrode 46 has the first interconnect electrode portion 46s and the second interconnect electrode portion 46t. The first interconnect electrode 46 is provided between the second semiconductor layer 13 and the third semiconductor layer 21. The first interconnect electrode 46 is electrically connected to the light-transmissive electrode 42. The first interconnect electrode 46 has a non-ohmic contact with the second semiconductor layer 13. Otherwise, the structure is similar to the structure of the semiconductor light emitting device 121 described above in regard to FIG. 15A to FIG. 15D.

An example of a method for manufacturing the semiconductor light emitting device 131 shown in FIG. 21A to FIG. 21D will now be described.

In the method for manufacturing the semiconductor light emitting device 131 shown in FIG. 21A to FIG. 21D, the method for forming the first interconnect electrode 46 differs from the method for forming the first interconnect electrode 46 of the semiconductor light emitting device 121 described above in regard to FIG. 15A to FIG. 15D. Otherwise, the manufacturing method is similar to the method for manufacturing the semiconductor light emitting device 121 described above in regard to FIG. 15A to FIG. 15D.

After growing the first crystal layer, dry etching of the second semiconductor layer 13 is performed. Thereby, the second semiconductor layer 13 is exposed. Ti/Pt/Au is formed with a thickness of 400 nm by lift-off. Thereby, the first interconnect electrode 46 is formed. The first interconnect electrode 46 is electrically connected to the light-transmissive electrode 42. The first interconnect electrode 46 contacts the exposed second semiconductor layer 13. The width (the first interconnect electrode width W1) of the first interconnect electrode 46 (referring to FIG. 22B) is, for example, about 10 μm.

The first interconnect electrode 46 has a non-ohmic contact with the second semiconductor layer 13. The contact resistance of the first interconnect electrode 46 is higher than the contact resistance of the light-transmissive electrode 42. It is sufficient for the first interconnect electrode 46 to have a non-ohmic contact with the second semiconductor layer 13, and/or the contact resistance of the first interconnect electrode to be higher than the contact resistance of the light-transmissive electrode 42. It is more desirable for the first interconnect electrode 46 to be insulated from the second semiconductor layer 13.

In the first direction (in the example, the Z-axis direction), the first interconnect electrode 46 substantially overlaps the second interconnect electrode 47. Thereby, the first light extraction region 17 is substantially aligned with the second light extraction region 27. Therefore, color breakup can be suppressed while increasing the light extraction efficiency.

In the specification of the application, "perpendicular" and "parallel" refer to not only strictly perpendicular and strictly parallel but also include, for example, the fluctuation due to manufacturing processes, etc. It is sufficient to be substantially perpendicular and substantially parallel.

Hereinabove, embodiments of the invention are described with reference to specific examples. However, the embodiments of the invention are not limited to these specific examples. For example, one skilled in the art may similarly practice the invention by appropriately selecting specific configurations of components included in the semiconductor light emitting device such as the semiconductor layer, the light emitting layer, the electrode, the bonding layer, the support substrate, the reflecting electrode, the back surface electrode, the insulating layer, the stacked body, etc., from known art; and such practice is within the scope of the invention to the extent that similar effects are obtained.

Further, any two or more components of the specific examples may be combined within the extent of technical feasibility and are included in the scope of the embodiments to the extent that the spirit of the embodiments is included.

Moreover, all semiconductor light emitting devices and methods for manufacturing the semiconductor light emitting device practicable by an appropriate design modification by one skilled in the art based on the semiconductor light emitting devices and the methods for manufacturing the semiconductor light emitting device described above as embodiments of the invention also are within the scope of the invention to the extent that the purport of the embodiments of the invention is included.

Various other variations and modifications can be conceived by those skilled in the art within the spirit of the invention, and it is understood that such variations and modifications are also encompassed within the scope of the invention.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A semiconductor light emitting device, comprising:
   a conductive layer;
   a first stacked body including a first semiconductor layer provided to be separated from the conductive layer in a first direction, a second semiconductor layer provided between the first semiconductor layer and the conductive layer, and a first light emitting layer provided between the first semiconductor layer and the second semiconductor layer, the first light emitting layer emitting a first light;
   a second stacked body including a third semiconductor layer provided between the second semiconductor layer and the conductive layer, a fourth semiconductor layer provided between the third semiconductor layer and the conductive layer, and a second light emitting layer provided between the third semiconductor layer and the fourth semiconductor layer, the second light emitting layer emitting a second light;
   a first light-transmissive electrode provided between the second semiconductor layer and the third semiconductor layer to have ohmic contacts with the second semiconductor layer and the third semiconductor layer, the first light-transmissive electrode transmitting the first light and the second light;
   a first interconnect electrode provided between the second semiconductor layer and the third semiconductor layer to be electrically connected to the first light-transmissive electrode;
   a first electrode electrically connected to the first semiconductor layer; and
   a second electrode electrically connected to the second semiconductor layer and the third semiconductor layer,
   wherein the first light-transmissive electrode has:

a first transmissive region provided between the second semiconductor layer and the third semiconductor layer, and a second transmissive region arranged with the first transmissive region in a direction perpendicular to the first direction, wherein the first semiconductor layer is disposed between the first electrode and the first light emitting layer, and wherein the second transmissive region is disposed between the second electrode and the third semiconductor layer.

2. The device according to claim 1, wherein the conductive layer has an ohmic contact with the fourth semiconductor layer.

3. The device according to claim 1, wherein the second electrode is provided to be separated from the conductive layer in the direction perpendicular to the first direction.

4. The device according to claim 1, wherein at least a portion of the first electrode overlaps the first interconnect electrode in the first direction.

5. The device according to claim 1, further comprising:
a first through-electrode piercing the conductive layer, the fourth semiconductor layer, and the second light emitting layer in the first direction to be electrically connected to the second semiconductor layer and the third semiconductor layer;
a first insulating layer provided between the first through-electrode and the fourth semiconductor layer and between the first through-electrode and the second light emitting layer;
a second through-electrode piercing the conductive layer, the second stacked body, the first light-transmissive electrode, the second semiconductor layer, and the first light emitting layer in the first direction to be electrically connected to the first semiconductor layer; and
a second insulating layer provided between the second through-electrode and the second stacked body, between the second through-electrode and the first light-transmissive electrode, between the second through-electrode and the second semiconductor layer, and between the second through-electrode and the first light emitting layer.

6. The device according to claim 1, further comprising:
a third stacked body including a fifth semiconductor layer provided to be separated from the first semiconductor layer in the first direction, a sixth semiconductor layer provided between the fifth semiconductor layer and the first semiconductor layer, and a third light emitting layer provided between the fifth semiconductor layer and the sixth semiconductor layer, the fifth semiconductor layer having a fifth conductivity type, the sixth semiconductor layer having a sixth conductivity type different from the fifth conductivity type;
a second light-transmissive electrode provided between the first semiconductor layer and the sixth semiconductor layer to have ohmic contacts with the first semiconductor layer and the sixth semiconductor layer, the second light-transmissive electrode being configured to transmit the light emitted by the first light emitting layer, the second light emitting layer, and the third light emitting layer; and
a second interconnect electrode provided between the first semiconductor layer and the sixth semiconductor layer, the second interconnect electrode being electrically connected to the second light-transmissive electrode.

7. The device according to claim 6, wherein at least a portion of the first interconnect electrode overlaps the second interconnect electrode in the first direction.

8. The device according to claim 1, wherein a peak wavelength of the second light is different from a peak wavelength of the first light.

\* \* \* \* \*